US009240429B2

(12) United States Patent
Mori et al.

(10) Patent No.: US 9,240,429 B2
(45) Date of Patent: Jan. 19, 2016

(54) IMAGE PICKUP DEVICE AND METHOD FOR PRODUCING THE SAME

(75) Inventors: Hiroki Mori, Yokohama (JP); Masaki Migita, Fujisawa (JP); Youichi Nagai, Takarazuka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 14/363,723

(22) PCT Filed: Jul. 6, 2012

(86) PCT No.: PCT/JP2012/067320
§ 371 (c)(1),
(2), (4) Date: Jun. 6, 2014

(87) PCT Pub. No.: WO2013/084529
PCT Pub. Date: Jun. 13, 2013

(65) Prior Publication Data
US 2014/0327101 A1 Nov. 6, 2014

(30) Foreign Application Priority Data
Dec. 9, 2011 (JP) ................................. 2011-270168

(51) Int. Cl.
H01L 27/146 (2006.01)
H01L 23/00 (2006.01)
H01L 25/00 (2006.01)

(52) U.S. Cl.
CPC .......... H01L 27/14636 (2013.01); H01L 24/11 (2013.01); H01L 24/13 (2013.01); H01L 24/14 (2013.01); H01L 24/81 (2013.01);
(Continued)

(58) Field of Classification Search
CPC ..................................... H01L 27/146–27/14893
See application file for complete search history.

(56) References Cited

U.S. PATENT DOCUMENTS

| | | | | |
|---|---|---|---|---|
| 5,646,426 A | * | 7/1997 | Cockrum et al. | 257/188 |
| 6,583,514 B2 | * | 6/2003 | Tago et al. | 257/778 |
| 2002/0079577 A1 | * | 6/2002 | Ho | 257/737 |
| 2010/0084755 A1 | | 4/2010 | Gerber et al. | |
| 2010/0171097 A1 | * | 7/2010 | Nagai et al. | 257/21 |
| 2011/0147707 A1 | | 6/2011 | Inada et al. | |

FOREIGN PATENT DOCUMENTS

| | | |
|---|---|---|
| JP | 06-232203 | 8/1994 |
| JP | 08-148495 | 6/1996 |

(Continued)

OTHER PUBLICATIONS

Notificaton of Reasons for Rejection (JP 2013-548109) dated Nov. 10, 2015.

Primary Examiner — Matthew Landau
Assistant Examiner — Eric Ward
(74) Attorney, Agent, or Firm — Smith, Gambrell & Russell LLP

(57) ABSTRACT

An image pickup device includes a light-receiving device unit, a processing portion, a first connection body, and a second connection body. The first connection body electrically connects a first electrode of the light-receiving device unit to a corresponding second electrode of the processing portion. The first connection body includes an indium-containing solder portion disposed between the first electrode and the second electrode, and a barrier layer for suppressing alloying of the solder portion with the first electrode and the second electrode. The second connection body includes an alloy portion formed by alloying with a solder containing a material having a melting point equal to or higher than a melting point of the first connection body and a hardness higher than that of the first connection body.

10 Claims, 10 Drawing Sheets

(52) U.S. Cl.
CPC ...... *H01L27/1469* (2013.01); *H01L 27/14618* (2013.01); *H01L 27/14634* (2013.01); *H01L 25/50* (2013.01); *H01L 2224/0401* (2013.01); *H01L 2224/06102* (2013.01); *H01L 2224/1147* (2013.01); *H01L 2224/11826* (2013.01); *H01L 2224/11903* (2013.01); *H01L 2224/1308* (2013.01); *H01L 2224/13109* (2013.01); *H01L 2224/13111* (2013.01); *H01L 2224/13144* (2013.01); *H01L 2224/13166* (2013.01); *H01L 2224/13169* (2013.01); *H01L 2224/1403* (2013.01); *H01L 2224/14505* (2013.02); *H01L 2224/16225* (2013.01); *H01L 2224/16227* (2013.01); *H01L 2224/7525* (2013.01); *H01L 2224/75753* (2013.01); *H01L 2224/81121* (2013.01); *H01L 2224/81193* (2013.01); *H01L 2224/81203* (2013.01); *H01L 2224/81815* (2013.01); *H01L 2924/014* (2013.01); *H01L 2924/01322* (2013.01); *H01L 2924/35121* (2013.01)

(56) References Cited

FOREIGN PATENT DOCUMENTS

| | | |
|---|---|---|
| JP | 2011-171554 | 9/2001 |
| JP | 2006-278884 | 10/2006 |
| JP | 2010-157667 | 7/2010 |
| JP | 2013-548109 | 11/2015 |
| WO | 2006/123554 A1 | 11/2006 |

\* cited by examiner

FIG. 4
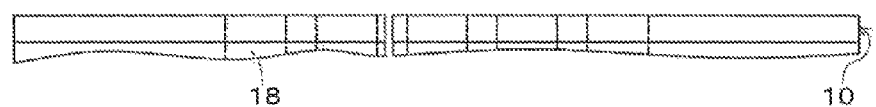
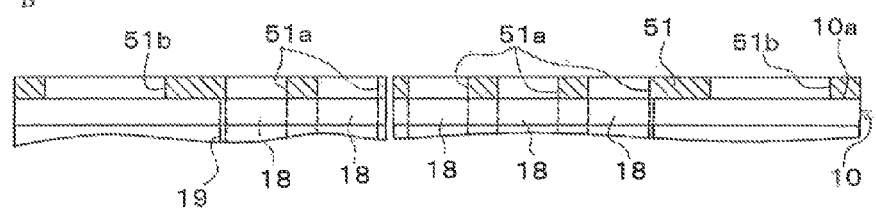
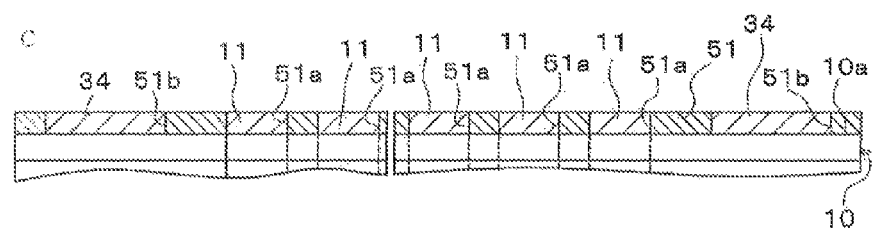
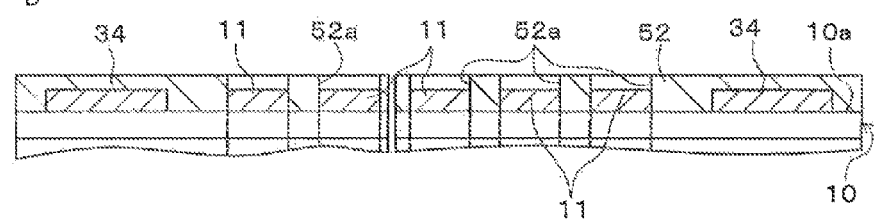

IMAGE PICKUP DEVICE AND METHOD FOR PRODUCING THE SAME

TECHNICAL FIELD

The present invention relates to an image pickup device, especially to an image pickup device including a light-receiving device and a processing portion processing a current from the light-receiving device that are connected to each other with a solder therebetween, and a method for producing the same.

BACKGROUND ART

Japanese Unexamined Patent Application Publication No. 2006-278884 (PTL 1) discloses a method for mounting a semiconductor chip on a circuit board. Specifically, PTL 1 discloses a structure in which a frame-shaped spacer is disposed between a semiconductor chip and a circuit board. A plurality of bump electrodes are provided on a surface of the semiconductor chip so as to surround the center of the surface. The spacer is disposed below the hump electrodes. A plurality of connection electrodes that are connected to the bump electrodes are formed on an upper end surface of the spacer. A plurality of bump electrodes are formed on a lower end surface of the spacer, and these bump electrodes on the lower end surface of the spacer are joined to land electrodes formed on the circuit board.

Japanese Unexamined Patent Application Publication No. 6-232203 (PTL 2) discloses a mounting structure of a flip-chip large-scale integration (LSI), the mounting structure including an electronic circuit board and an LSI mounted on the electronic circuit board in a face-down manner. In PTL 2, a net-like spacer that is composed of an insulating material and that separates solder bumps adjacent to each other is disposed between the LSI and the electronic circuit board.

SUMMARY OF INVENTION

Technical Problem

An image pickup device including a semiconductor includes, for example, a light-receiving device unit that includes a plurality of light-receiving devices and a processing portion that processes a signal current from each of the light-receiving devices. The light-receiving device unit includes a plurality of light-receiving devices and a plurality of electrodes formed so as to correspond to the respective light-receiving devices. These electrodes and a plurality of corresponding electrodes formed on a surface of the processing portion are connected to each other with solder portions therebetween. With this structure, a current generated as a result of light reception by each of the light-receiving devices is output to the processing portion through the solder portions.

The image pickup device having the above structure is used in various environments. For example, the image pickup device may be used in a low-temperature environment in which the processing portion is cooled to several tens of degrees below zero in order to reduce a noise current in the processing portion. In such a case, when the material of the light-receiving device unit and the material of the processing portion are different from each other, the difference between thermal shrinkages of the light-receiving device unit and the processing portion becomes large. As a result, a stress in a connecting portion between the solder portion and the light-receiving device unit and a stress in a connecting portion between the solder portion and the processing portion increase. When the solder portions cannot withstand these stresses, the solder portions are peeled off from the light-receiving device unit or the processing portion. At a position where a solder portion is peeled off, a current from a light-receiving device cannot be transmitted to the processing portion. As a result, an image defect such as a missing pixel may occur in the resulting image data.

In order to suppress this problem, solder bumps which connect the light-receiving device unit to the processing portion are preferably made of a soft material. In this case, the difference in the thermal shrinkage may be absorbed in the solder portions of the solder bumps. Solder bumps containing indium (In) may be used as such a material. However, when electrodes of light-receiving devices are connected to electrodes of a processing portion by using solder bumps containing In, the molten solder bumps at a high temperature are alloyed with a metal (such as Au) of the electrodes to form a hard alloy. Therefore, the softness of the solder is lost. As a result, solder portions cannot withstand thermal stress due to the strain, and peeling of the solder portions may occur.

To address the above problem, a barrier layer may be provided on each of the electrodes. By providing the barrier layers, direct contact between the respective electrodes and solder bumps is suppressed. Thus, it is possible to suppress the hardening of the solder bumps caused by the formation of an alloy with the electrodes.

However, when solder bumps are made of a soft material, the following problem may occur. When electrodes are connected to each other by melting the solder humps, the solder bumps are compressed and may be excessively flattened by, for example, a load from a chip bonder that holds a light-receiving device unit and that melts the solder bumps. This flattening may cause short-circuiting due to contact between adjacent solder portions. As a result, a current from a light-receiving device corresponding to the short-circuited solder cannot be accurately transmitted to the processing portion, and an image defect may occur.

In order to prevent such short-circuiting, for example, by arranging the net-like spacer disclosed in PTL 2 between a light-receiving device unit and a processing portion, flattening of solder bumps during melting may be suppressed. However, in light-receiving devices of an image pickup device, a large number of electrodes are usually arranged at a very narrow pitch of several tens of micrometers. Thus, it is difficult to accurately position a spacer with respect to the electrodes. Furthermore, a special spacer for suppressing the flattening of a solder is necessary. Therefore, the production of the image pickup device requires the time, labor, and money.

An image pickup device according to an aspect of the present invention includes a light-receiving device unit including a light-receiving device unit main body including a plurality of light-receiving devices and a plurality of first electrodes formed on a surface of the light-receiving device unit main body so as to correspond to the light-receiving devices, each of the light-receiving devices outputting a current based on intensity of received light; a processing portion including a plurality of second electrodes that face the first electrodes, and a processing portion main body including a surface having the second electrodes thereon, the processing portion main body processing the current; a plurality of first connection bodies that connect the first electrodes to the corresponding second electrodes; and a second connection body that connects the light-receiving device unit to the processing portion. The first connection bodies each include a solder portion disposed between the first electrode and the second electrode and barrier layers that are disposed between the solder portion and the first electrode and between the solder portion and the second electrode, the solder portion containing indium, the barrier layers suppressing alloying of the solder portion with the first electrode and the second electrode. In addition, the second connection body includes an alloy portion composed of a material having a melting point equal to or higher than that of the first connection bodies and a hardness higher than that of the first connection bodies.

According to the above structure, the first connection bodies each include barrier layers. Accordingly, it is possible to suppress the formation of a hard alloy as a result of alloying of the solder portion with the first electrode and the second electrode. Furthermore, the first connection bodies each include a soft solder portion containing indium, and thus can withstand a large strain due to heat. This structure can reliably suppress peeling of the solder portion from each of the first electrode and the second electrode (the light-receiving device unit main body and the processing portion). Accordingly, with regard to image data to be formed, occurrence of an image defect such as a missing pixel can be suppressed. Furthermore, the alloy portion of the second connection body is formed of a solder material containing a material having a melting point equal to or higher than that of the first connection bodies and a hardness higher than that of the first connection bodies, and are harder than the solder portions of the first connection bodies. Thus, the second connection body functions as a spacer between the light-receiving device unit and the processing portion. For example, in a step of connecting the light-receiving device unit to the processing portion with molten solder bumps, the second connection body serving as the spacer may prevent a gap between the light-receiving device unit and the processing portion from becoming excessively narrow. Accordingly, in the step of connecting the light-receiving device unit to the processing portion, flattening of the molten solder bumps between the light-receiving device unit and the processing portion is suppressed. Here, the molten solder bumps are used for forming the solder portions of the first electrode bodies. As a result, short-circuiting caused by adjacent solder portions being joined can be suppressed. Thus, it is possible to suppress the occurrence of defective electrical contacts from the respective light-receiving devices to the processing portion.

The second connection body preferably contains, in a part or the whole area thereof, Sn and one selected from the group consisting of Au, Ag, Cu, Zn, Ni, and Al.

Tin (Sn) has a melting point of 232° C. In addition, tin (Sn) promotes alloying with another metal constituting the second connection body at a relatively low temperature near the melting point, and can connect a first connection body to a second connection body. The other metal is selected so that the melting point of the resulting product alloyed with Sn is higher than the melting point of the first connection bodies. Examples thereof include Au, Ag, Cu, Zn, Ni, and Al. The second connection body containing any of these metals can be easily formed by photolithography, an evaporation method, and a lift-off method, for example, as in the case of Sn without significantly increasing the production cost.

Thus, the second connection body having a melting point equal to or higher than that of the first connection bodies and a hardness higher than that of the first connection bodies can be easily formed.

In addition, since the formation is performed at a relatively low temperature, thermal damage on the light-receiving device unit and the processing portion that processes a current is small, and degradation of the performance can be prevented. For example, when the light-receiving device unit includes an InGaAs light-receiving device or an InGaAs/GaAsSb quantum well light-receiving device, which has a sensitivity in the near-infrared band, a AuZn-based electrode or a AuGeNi-based electrode is generally used as an electrode material that can establish an ohmic contact with an InP or InGaAs layer serving as a surface layer. However, the alloying temperature of the electrode is 340° C. to 450° C. In order to prevent the light-receiving device unit from being damaged, preferably, the temperature is not increased to 340° C. or higher when the connection is established, and Sn, which has a melting point of 232° C., is preferably used.

It is sufficient that Sn is contained, and Sn having a purity of 100% is not necessarily contained. The same advantage can be obtained by using, for example, a eutectic solder of Ag 3.5%-Sn 96.5% (melting point: 221° C.), a eutectic solder of Au 80%-Sn 20% (melting point: 280° C.), a eutectic solder of Au 10%-Sn 90% (melting point: 217° C.), a eutectic solder of Cu 0.7%-Sn 99.3% (melting point: 227° C.), a eutectic solder of Ni 0.15%-Sn 99.85% (melting point: 221° C.), a eutectic solder of Zn 9%-Sn 91% (melting point: 199° C.), or a eutectic solder of Al 0.5%-Sn 99.5% (melting point: 228.3° C.). Herein, "%" represents "% by mass".

The second connection body may contain Sn in a part thereof, and the part containing Sn may have a thickness of 1% or more and less than 30% of a total thickness of the second connection body.

When alloying with another metal constituting the second connection body is promoted and the connection of between a first connection body and a second connection body is established at a temperature near the melting point of Sn, under some connecting conditions, Sn may melt or become soft before the formation of an alloy layer, and does not function as stoppers. Consequently, the gap between the light-receiving device unit and the processing portion may become excessively narrow.

Even in such a case, when a part containing Sn has a thickness of 1% or more and less than 30% of the total thickness of a second connection body, the gap between the light-receiving device unit and the processing portion does not excessively become narrow because the gap is at most 1% to 30% of the total thickness of the second connection body. Accordingly, short-circuit caused by adjacent solder portions being joined does not occur even when connection conditions are varied, and thus a stable connection can be established.

The same advantage can he obtained by using a eutectic solder of Ag 3.5%-Sn 96.5% (melting point: 221° C.), a eutectic solder of Au 80%-Sn 20% (melting point: 280° C.), a eutectic solder of Au 10%-Sn 90% (melting point: 217° C.), a eutectic solder of Cu 0.7%-Sn 99.3% (melting point: 227° C.), a eutectic solder of Ni 0.15%-Sn 99.85% (melting point: 221° C.), a eutectic solder of Zn 9%-Sn 91% (melting point: 199° C.), or a eutectic solder of Al 0.5%-Sn 99.5% (melting point: 228.3° C.) instead of using Sn having a purity of 100%.

The second connection body preferably includes an alloy portion formed by alloying a metal the same as a material of at least one of the first electrodes and the second electrodes with a solder containing indium.

According to the above structure, the first connection bodies each include barrier layers. Accordingly, it is possible to suppress the formation of a hard alloy as a result of alloying of the solder portion with the first electrode and the second electrode. Furthermore, the first connection bodies each include a soft solder portion containing indium, and thus can withstand a large strain due to heat. This structure can reliably suppress peeling of the solder portion from each of the first electrode and the second electrode (the light-receiving device unit main body and the processing portion). Accordingly, with regard to image data to be formed, occurrence of an image defect such as a missing pixel can be suppressed. In addition, the alloy portion of the second connection body is formed by alloying a metal the same as that of at least one of the first electrode and the second electrode with a solder material containing indium, and is harder than the solder portion. Therefore, the second connection body functions as a spacer between the light-receiving device unit and the processing portion. For example, in a step of connecting the light-receiving device unit to the processing portion with molten solder bumps, the second connection body serving as the spacer may prevent a gap between the light-receiving device unit and the processing portion from becoming excessively narrow. Accordingly, in the step of connecting the light-receiving device unit to the processing portion, flattening of the molten solder bumps between the light-receiving device unit and the processing portion is suppressed. Here, the molten solder bumps are used for forming the solder portions of the first electrode bodies. As a result, short-circuiting caused by adjacent solder portions being joined can be suppressed. Thus, it is possible to suppress the occurrence of defective electrical contacts from the respective light-receiving devices to the processing portion. In addition, the time and labor necessary for forming the second connection body are small, and thus the image pickup device can be easily produced and the production cost can be reduced. Specifically, for example, in a step of forming first electrodes on a surface of a light-receiving device unit main body, a first metal layer which is insulated from light-receiving devices is formed, simultaneously. A barrier layer is then formed only on each of the first electrodes out of the first electrodes and the first metal layer. In a step of forming second electrodes on a surface of a processing portion main body, a second metal layer is also formed, simultaneously. A barrier layer is then formed only on each of the second electrodes out of the second electrodes and the second metal layer. Subsequently, in a step of connecting the light-receiving device unit to the processing portion, the barrier layer on each of the first electrodes is connected to the barrier layer on the corresponding second electrode using molten solder bumps. Thus, first connection bodies are formed. Simultaneously, the first metal layer is connected to the second metal layer using molten solder bumps. As a result, the solder bumps are alloyed with at least one of the first metal layer and the second metal layer to form a second connection body including an alloy portion. Specifically, the structure of the second connection body corresponds to a structure in which the barrier layers of each of the first connection bodies are eliminated. Accordingly, the first connection body and the second connection body can be easily separately formed by using the slight difference between the operation in which the barrier layers are formed on a portion where the first connection body is to be formed and the operation in which the barrier layers are not formed on a portion where the second connection body is to be formed. Furthermore, by melting the solder bumps for forming the first connection bodies and the solder bumps for forming the second connection body at the same time, the first connection bodies and the second connection body can be formed, simultaneously. Therefore, the image pickup device can be easily produced. In addition, the second connection body functions as a spacer between the light-receiving device unit and the processing portion, and thus an additional spacer need not be separately provided and the production cost can be reduced.

Accordingly, it is possible to realize an image pickup device which can withstand a large temperature change, can accurately and reliably output a current from a light-receiving device to a processing portion, can be easily produced, and is inexpensive.

The first connection body and the second connection body are preferably arranged at a pitch larger than a pitch of arrangement between the first connection bodies adjacent to each other.

By arranging the second connection body so as to be sufficiently separated from the first connection body in this manner, in the step of connecting the light-receiving device unit to the processing portion with a solder, it is possible to suppress joining between a solder melted for forming the second connection body and a solder melted for forming the first connection body.

The light-receiving devices are preferably arranged in a predetermined image pickup area defined in the light-receiving device unit, and the second connection body is preferably arranged outside the image pickup area.

By arranging the second connection body outside the image pickup area where the light-receiving devices are arranged in this manner, in the step of connecting the light-receiving device unit to the processing portion, it is possible to suppress contact between a solder melted for forming the second connection body and a solder melted for forming the first connection bodies. Accordingly, in the step of connecting the light-receiving device unit to the processing portion with a solder, it is not necessary to exactly position the light-receiving device unit and the processing portion for the purpose of suppressing contact between a solder for forming the second connection body and a solder of the first connection bodies. Thus, the image pickup device can be more easily produced.

On a cross section orthogonal to a facing direction in which the light-receiving device unit and the processing portion face each other, the second connection body preferably has a cross-sectional area different from a cross-sectional area of each of the first connection bodies.

For example, in the step of connecting the light-receiving device unit to the processing portion, as a result of alloying of a solder material with a metal material, an alloy portion may be formed while expanding. For example, by making the cross-sectional area of the second connection body smaller than the cross-sectional area of each of the first connection bodies, the amount of volume expansion due to alloying can be decreased. As a result, contact of the second connection body with the first connection bodies can be suppressed. On the other hand, when the cross-sectional area of the second connection body is larger than the cross-sectional area of each of the first connection bodies, the second connection body can be formed so as to have a wider width. With this structure, the alloy portion can more reliably functions as a spacer between the light-receiving device unit and the processing portion.

A method for producing an image pickup device according to another aspect of the present invention, includes the steps of preparing a light-receiving device unit including a light-receiving device unit main body including a plurality of light-receiving devices each of which outputs a current based on intensity of received light, a plurality of first electrodes formed on a surface of the light-receiving device unit main body so as to correspond to the light-receiving devices, a first barrier layer formed on each of the first electrodes, and a first metal layer formed on the surface; preparing a processing portion including a plurality of second electrodes that correspond to the first electrodes, a processing portion main body that includes a surface having the second electrodes thereon and that processes the current, a second barrier layer formed on each of the second electrodes, and a second metal layer formed on the surface of the processing portion main body; and connecting the light-receiving device unit to the processing portion. The step of connecting the light-receiving device unit to the processing portion further includes the steps of forming first connection bodies each including the first barrier layer, the second barrier layer, and a solder portion by connecting the first barrier layer to the second barrier layer with a molten solder bump containing indium; and forming a second connection body including a solder composed of a material having a melting point equal to or higher than that of the first connection bodies and a hardness higher than that of the first connection bodies.

According to the above method, the first connection bodies each include barrier layers. Accordingly, it is possible to suppress the formation of a hard alloy as a result of alloying of the solder portion with the first electrode and the second electrode. Furthermore, the first connection bodies each include a soft solder portion containing indium. Therefore, each of the first connection bodies can withstand a large strain due to heat. In addition, peeling of the solder portion from each of the first electrode and the second electrode (the light-receiving device unit and the processing portion) is reliably suppressed. Accordingly, with regard to image data to be formed, the occurrence of an image defect such as a missing pixel can be suppressed. In addition, the alloy portion of the second connection body is formed by alloying at least one of the first metal layer and the second metal layer with a solder bump containing indium, and is harder than the solder portion. Therefore, the second connection body functions as a spacer between the light-receiving device unit and the processing portion. Thus, in a step of connecting the light-receiving device unit to the processing portion, the second connection body serving as the spacer may prevent a gap between the light-receiving device unit and the processing portion from becoming excessively narrow. Accordingly, in the step of connecting the light-receiving device unit to the processing portion, flattening of the molten solder bumps between the light-receiving device unit and the processing portion is suppressed. Here, the molten solder bumps are used for forming the solder portions of the first electrode bodies. As a result, short-circuiting caused by adjacent solder portions being joined can be suppressed. Thus, it is possible to suppress the occurrence of defective electrical contacts from the respective light-receiving devices to the processing portion.

Accordingly, it is possible to realize an image pickup device which can withstand a large temperature change, can accurately and reliably output a current from a light-receiving device to a processing portion, can be easily produced, and is inexpensive.

The second connection body preferably contains, in a part or the whole area thereof, Sn and one selected from the group consisting of Au, Ag, Cu, Zn, Ni, and Al.

Tin (Sn) has a melting point of 232° C. In addition, tin (Sn) promotes alloying with another metal constituting the second connection body at a relatively low temperature near the melting point, and can connect a first connection body to a second connection body. The other metal is selected so that the melting point of the resulting product alloyed with Sn is higher than the melting point of the first connection bodies. Examples thereof include Au, Ag, Cu, Zn, Ni, and Al. The second connection body containing any of these metals can be easily formed by photolithography, an evaporation method, and a lift-off method, for example, as in the case of Sn without significantly increasing the production cost.

Thus, the second connection body having a melting point equal to or higher than that of the first connection bodies and a hardness higher than that of the first connection bodies can be easily formed.

In addition, since the formation is performed at a relatively low temperature, thermal damage on the light-receiving device unit and the processing portion that processes a current is small, and degradation of the performance can be prevented. For example, when the light-receiving device unit includes an InGaAs light-receiving device or an InGaAs/GaAsSb quantum well light-receiving device, which has a sensitivity in the near-infrared band, a AuZn-based electrode or a AuGeNi-based electrode is generally used as an electrode material that can establish an ohmic contact with an InP or InGaAs layer serving as a surface layer. However, the alloying temperature of the electrode is 340° C. to 450° C. In order to prevent the light-receiving device unit from being damaged, preferably, the temperature is not increased to 340° C. or higher when the connection is established, and Sn, which has a melting point of 232° C., is preferably used.

It is sufficient that Sn is contained, and Sn having a purity of 100% is not necessarily contained. The same advantage can be obtained by using, for example, a eutectic solder of Ag 3.5%-Sn 96.5% (melting point: 221° C.), a eutectic solder of Au 80%-Sn 20% (melting point: 280° C.), a eutectic solder of Au 10%-Sn 90% (melting point: 217° C.), a eutectic solder of Cu 0.7%-Sn 99.3% (melting point: 22.7° C.), a eutectic solder of Ni 0.15%-Sn 99.85% (melting point: 221° C.), a eutectic solder of Zn 9%-Sn 91% (melting point: 199° C.), or a eutectic solder of Al 0.5%-Sn 99.5% (melting point: 228.3° C.), The second connection body preferably includes an alloy portion formed by alloying a metal the same as a material of at least one of the first electrodes and the second electrodes with a solder containing indium.

According to the above method, the first connection bodies each include barrier layers. Accordingly, it is possible to suppress the formation of a hard alloy as a result of alloying of the solder portion with the first electrode and the second electrode. Furthermore, the first connection bodies each include a soft solder portion containing indium. Therefore, each of the first connection bodies can withstand a large strain due to heat. in addition, peeling of the solder portion from each of the first electrode and the second electrode (the light-receiving device unit and the processing portion) is reliably suppressed. Accordingly, with regard to image data to be formed, the occurrence of an image defect such as a missing pixel can be suppressed.

In addition, the alloy portion of the second connection body is formed by alloying at least one of the first metal layer and the second metal layer with a solder bump containing indium, and is harder than the solder portion. Therefore, the second connection body functions as a spacer between the light-receiving device unit and the processing portion. Thus, in a step of connecting the light-receiving device unit to the processing portion, the second connection body serving as the spacer may prevent a gap between the light-receiving device unit and the processing portion from becoming excessively narrow.

Accordingly, in the step of connecting the light-receiving device unit to the processing portion, flattening of the molten solder bumps between the light-receiving device unit and the processing portion is suppressed. Here, the molten solder bumps are used for forming the solder portions of the first electrode bodies. As a result, short-circuiting caused by adjacent solder portions being joined can be suppressed. Thus, it is possible to suppress the occurrence of defective electrical contacts from the respective light-receiving devices to the processing portion. In addition, the time and labor necessary for forming the second connection body are small, and thus the image pickup device can be easily produced and the production cost can be reduced.

Specifically, for example, in a step of forming first electrodes on a surface of a light-receiving device unit main body, a first metal layer which is insulated from light-receiving devices is formed, simultaneously. A barrier layer is then formed only on each of the first electrodes out of the first electrodes and the first metal layer. In a step of forming second electrodes on a surface of a processing portion main body, a second metal layer is also formed, simultaneously. A barrier layer is then formed only on each of the second electrodes out of the second electrodes and the second metal layer. Subsequently, in a step of connecting the light-receiving device unit to the processing portion, the barrier layer on each of the first electrodes is connected to the barrier layer on the corresponding second electrode using molten solder bumps. Thus, first connection bodies are formed. Simultaneously, the first metal layer is connected to the second metal layer using molten solder bumps. As a result, the solder bumps are alloyed with at least one of the first metal layer and the second metal layer to form a second connection body including an alloy portion. Specifically, the structure of the second connection body corresponds to a structure in which the barrier layers of each of the first connection bodies are eliminated. Accordingly, the first connection body and the second connection body can be easily separately formed by using the slight difference between the operation in which the barrier layers are formed on a portion where. the first connection body is to be formed and the operation in which the barrier layers are not formed on a portion where the second connection body is to be formed.

Furthermore, by melting the solder bumps for forming the first connection bodies and the solder bumps for forming the second connection body at the same time, the first connection bodies and the second connection body can be formed, simultaneously. Therefore, the image pickup device can be easily produced. In addition, the second connection body functions as a spacer between the light-receiving device unit and the processing portion, and thus an additional spacer need not be separately provided and the production cost can be reduced.

In the step of connecting, a solder bump disposed between the first barrier layer and the second barrier layer that face each other preferably has a thickness different from a thickness of a solder bump disposed between the first metal layer and the second metal layer that face each other.

According to the above method, for example, the thickness of a solder bump between the first metal layer and the second metal layer can be made larger than the thickness of a solder bump between the first barrier layer and the second barrier layer. Accordingly, the length of an alloy portion formed by alloying of the solder bump with the first metal layer and the second metal layer can be made large. Thus, the alloy portion can more reliably function as a spacer between the light-receiving device unit and the processing portion. On the other hand, the thickness of a solder bump between the first metal layer and the second metal layer can be made smaller than the thickness of a solder bump between the first barrier layer and the second barrier layer. In this case, the formation of an excessively large alloy portion can be suppressed, and contact of the alloy portion with a first connection body can be suppressed.

In the step of connecting, the first metal layer and the second metal layer are preferably provided as recognition portions that aid recognition of relative positions of the light-receiving device unit and the processing portion.

In this case, in the step of connecting the light-receiving device unit to the processing portion, the light-receiving device unit and the processing portion can be positioned by using the first metal layer of the light-receiving device unit and the second metal layer of the processing portion as recognition portions. Accordingly, each of the first electrodes of the light-receiving device unit and the corresponding second electrode of the processing portion can be accurately positioned, and connected to each other with a solder. In addition, additional recognition portions that aid positioning of the light-receiving device unit and the processing portion need not be separately provided, and thus the time, labor, and cost necessary for producing the image pickup device can be further reduced.

BRIEF DESCRIPTION OF DRAWINGS

FIG. 4 includes schematic views illustrating steps of producing a light-receiving device unit, and parts A to D sequentially show steps of producing the light-receiving device unit.

DESCRIPTION OF EMBODIMENTS

Figure 1:
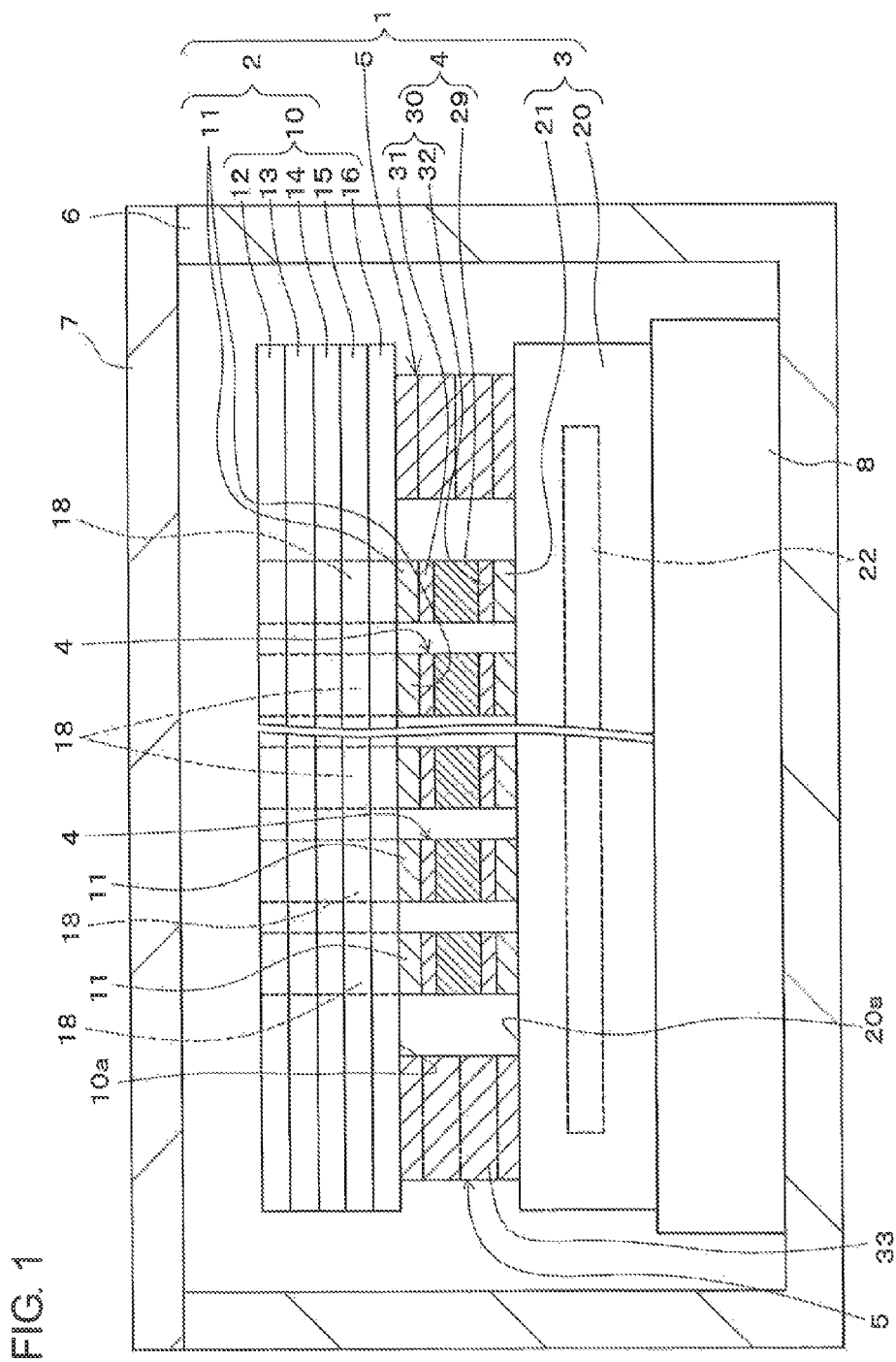
FIG. 1 is a lateral view showing a schematic structure of an image pickup device according to an embodiment of the present invention, and a part thereof is shown as a cross section.

Embodiments of the present invention will now be described with reference to the drawings. In the drawings, the same parts and corresponding parts are assigned the same reference numerals, and a description of those parts is not repeated.

(Structure of Image Pickup Device)

FIG. 1 is a lateral view showing a schematic structure of an image pickup device 1 according to an embodiment of the present invention, and a part thereof is shown as a cross section.

As shown in FIG. 1, the image pickup device 1 includes a light-receiving device unit 2, a processing portion 3, first connection bodies 4, and second connection bodies 5. The image pickup device 1 has a hybrid structure in which the light-receiving device unit 2 made of a compound semiconductor and the processing portion 3 made of silicon are integrated.

The light-receiving device unit 2 is composed of a sensor ship or the like. The light-receiving device unit 2 receives light from an imaging object and outputs a current based on the received light to the processing portion 3. The processing portion 3 converts the received current to a voltage, and outputs the voltage to the outside of a case 6. An A/D converter and a central processing unit (CPU) (not shown) are provided outside the case 6. The output voltage is converted to a digital value and used in image processing. This image pickup device 1 is, for example, a hyper spectral camera and is used for obtaining spectral information of an imaging object.

The image pickup device 1 is housed in the case 6. The case 6 is formed of, for example, a ceramic material. The case 6 is formed so as to have a shape of a box, the upper portion of which is opened. A light-transmissive member 7 is disposed on the upper portion of the case 6. The light-transmissive member 7 is formed of, for example, sapphire glass and covers an upper surface of the case 6. The case 6 inside is maintained in vacuum. Light from the imaging object passes through the light-transmissive member 7 and is incident on the light-receiving device unit 2.

A heat exchanger 8 is disposed on a bottom portion of the case 6. The heat exchanger 8 supports the processing portion 3. The heat exchanger 8 is provided for cooling the processing portion 3 and the light-receiving device unit 2. For example, the heat exchanger 8 cools the processing portion 3 to about several tens of degrees below zero, about 60 degrees below zero in the present embodiment. This structure reduces a noise current in the image pickup device 1, in particular, in the processing portion 3. The heat exchanger 8 includes, for example, a Peltier device. Heat absorbed by the heat exchanger 8 from the processing portion 3 is discharged to the outside of the case 6 by using a cooling fin or fan (not shown) provided outside the case 6.

The light-receiving device unit 2 is configured to detect light having a wavelength in the near-infrared region or in the vicinity of the near-infrared region, and detects light having a wavelength of, for example, about 1 to 3 μm. In the present embodiment, the light-receiving device unit 2 is formed so as to have a rectangular shape having a length of 10 mm, a width of 10 mm, and a thickness of about several hundred micrometers.

The light-receiving device unit 2 includes a light-receiving device unit main body 10 and first electrodes 11. The light-receiving device unit main body 10 has a layered structure including an n-type InP substrate 12, a buffer layer 13, an absorption layer 14, a diffusion concentration distribution adjusting layer 15, and an InP cap layer 16. The absorption layer 14 is formed of a compound semiconductor so as to have a sensitivity to light having the above wavelength. Examples of such a compound semiconductor include InGaAsNP, InP-GaAsNSb, and InGaAsN. In the present embodiment, the absorption layer 14 has a multi-quantum well (MQW) structure composed of InGaAs/GaAsSb. A spectrometer (not shown) is disposed on a surface of the InP substrate 12. The diffusion concentration distribution adjusting layer 15 is a layer for adjusting a diffusion profile when a p-n junction is formed by selective diffusion. The diffusion concentration distribution adjusting layer 15 is provided according to need.

The light-receiving device unit main body 10 having the above-described structure includes a plurality of light-receiving devices 18 each including a p-type region. Each of the light-receiving devices 18 receives light incident on the InP substrate 12 through the spectrometer, and outputs a current based on light intensity of the received light. The light-receiving devices 18 are formed in a matrix shape in the light-receiving device unit 2. In the present embodiment, 320×256 light-receiving devices 18 are formed, and the number of pixels of the light-receiving device unit 2 is 320×256 that is about 82,000. In the present embodiment, for the sake of convenience of explanation, each of the light-receiving devices 18 and structures relating thereto are schematically shown in the drawings in an enlarged manner.

A surface of the InP cap layer 16 constitutes a surface 10a of the light-receiving device unit main body 10 and faces the processing portion 3. The first electrodes 11 are formed on the surface 10a. The first electrodes 11 are each formed in the form of a thin film by using a p-type electrode which may establish an ohmic contact with a light-receiving device on the side contacting the light-receiving device 18. Examples of such a metal include a AuZn-based electrode and a Pt-based electrode. In the present embodiment, each of the first electrodes 11 is formed of an AnZu-based electrode. In order to stably establish an ohmic contact, after the formation of the first electrodes 11, heat treatment is performed at 340° C. to 450° C. for several minutes. Each of the first electrodes 11 is formed so as to have a size of about 10 μm square.

Figure 2:
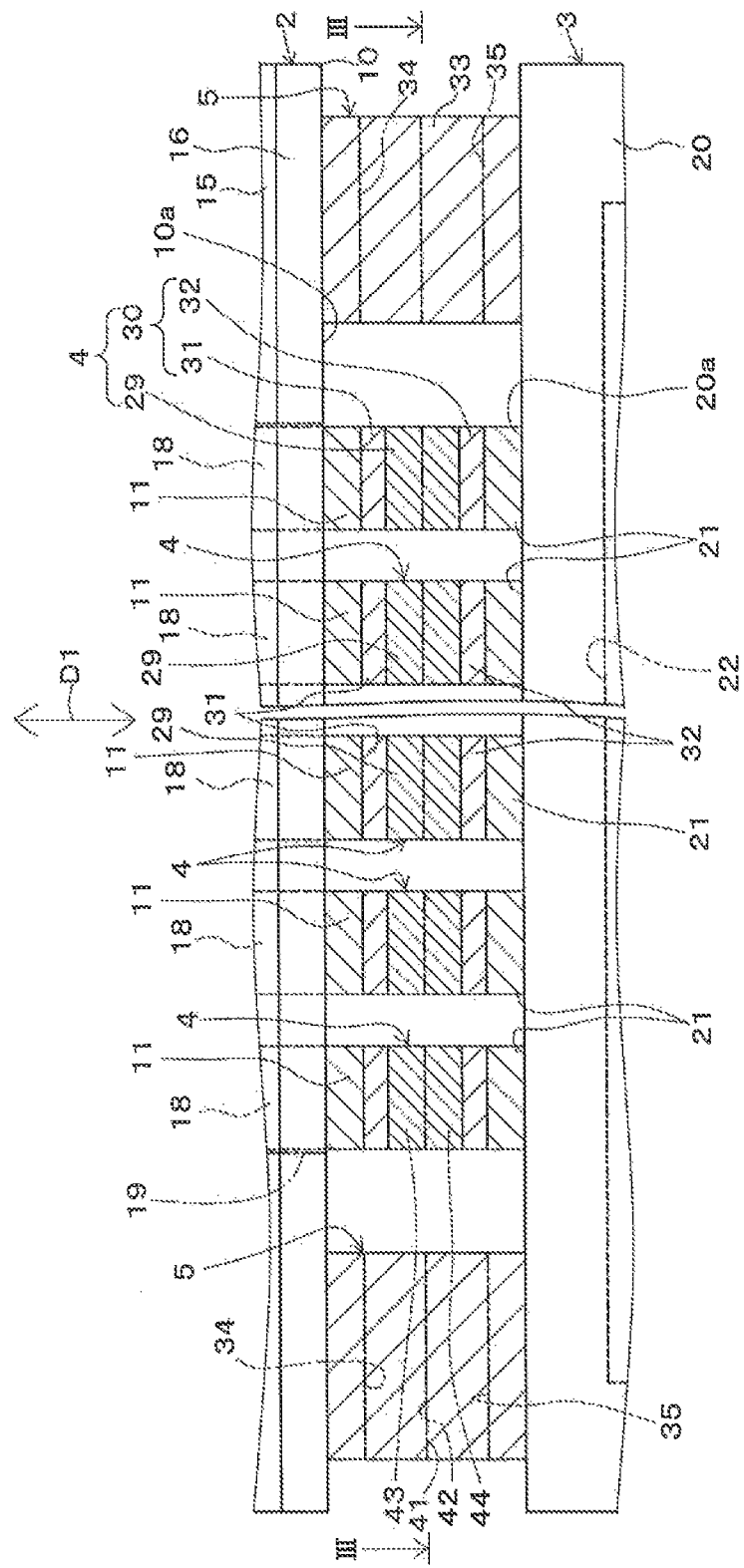
FIG. 2 is a lateral view of a main portion of an image pickup device, and a part thereof is shown as a cross section.
Figure 3:
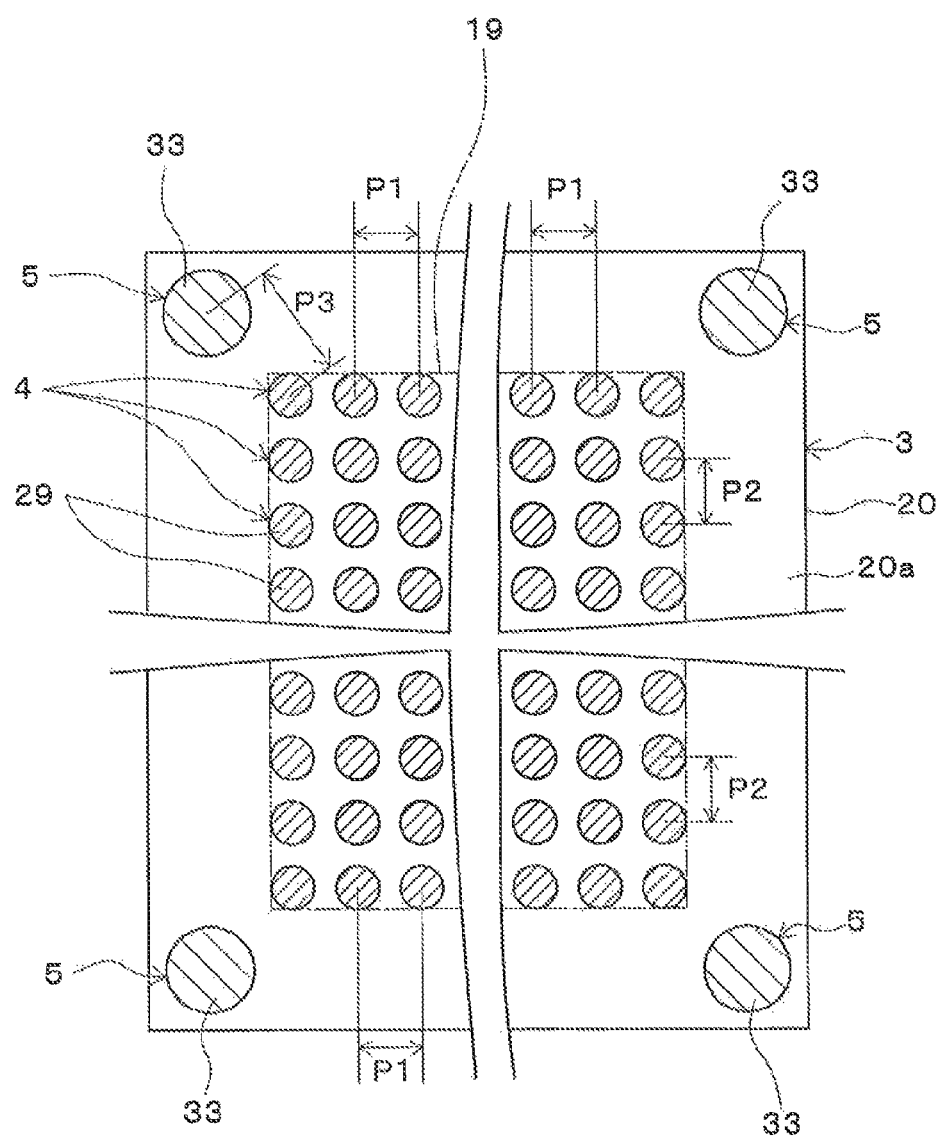
FIG. 3 is a schematic cross-sectional view of the image pickup device taken along line III-III of FIG. 2.

FIG. 2 is a lateral view of a main portion of the image pickup device 1, and a part thereof is shown as a cross section. FIG. 3 is a schematic cross-sectional view of the image pickup device 1 taken along line III-III of FIG. 2. Referring to FIGS. 2 and 3, a plurality of first electrodes 11 are provided so as to correspond to a plurality of light-receiving devices 18. That is, one first electrode 11 is provided for one light-receiving device 18. The position of each of the light-receiving devices 18 overlaps with the position of the corresponding first electrode 11 in plan view, and the light-receiving device 18 and the first electrode 11 are electrically connected to each other.

The first electrodes 11 are arranged in a lateral direction of the light-receiving device unit 2 at a pitch P1 of several tens of micrometers, and in a longitudinal direction of the light-receiving device unit 2 at a pitch P2 of several tens of micrometers. In the present embodiment, pitch P1=P2=30 μm, and the light-receiving devices 18 are arranged in the form of a tetragonal lattice.

The light-receiving devices 18 and the first electrodes 11 are arranged in an image pickup area 19. The term "image pickup area 19" refers to an area surrounding an area where the light-receiving devices 18 and the first electrodes 11 are arranged when the light-receiving device unit 2 is viewed in plan view. In other words, the term "image pickup area 19" refers to an area which is divided by light-receiving devices 18 and in which other light-receiving devices 18 are not arranged outside the light-receiving device unit 2 when the light-receiving device unit 2 is viewed in plan view. The image pickup area 19 is formed so as to have a rectangular shape in plan view.

The processing portion 3 is composed of a read-out integrated circuit (ROIC) or the like. This ROIC 3 is composed of a semiconductor device such as a complementary metal oxide semiconductor (CMOS) device, and processes a current received from the light-receiving device unit 2. The processing portion 3 is disposed below the light-receiving device unit 2 and includes a processing portion main body 20 and second electrodes 21.

The processing portion main body 20 includes a processing circuit 22 that processes a current from the light-receiving device unit 2. The processing circuit 22 converts a current from each of the light-receiving devices 18 to a voltage. The processing portion 3 is formed so as to have substantially the same shape as the light-receiving device unit 2. A surface 20a of the processing portion main body 20 faces the surface 10a of the light-receiving device unit main body 10 in a facing direction D1. The term "facing direction D1" refers to a direction in which the light-receiving device unit 2 and the processing portion 3 face each other. The second electrodes 21 are formed on the surface 20a.

The second electrodes 21 are each formed in the form of a thin film by using a metal that may be used for solder connection. Examples of such a metal include gold (Au) and aluminum (Al). In the present embodiment, each of the second electrodes 21 is formed of a Au pad.

A plurality of second electrodes 21 are provided so as to correspond to the plurality of first electrodes 11. That is, one second electrode 21 is provided for one first electrode 11. Each of the first electrodes 11 and the corresponding second electrode 21 face in the facing direction D1, and are electrically connected to each other with a first connection body 4 therebetween. With this structure, a current from each light-receiving device 18 passes through the corresponding first electrode 11, first connection body 4, and second electrode 21, and flows to the processing circuit 22 in the processing portion main body 20. The second electrodes 21 are formed so as to have the same size as the first electrodes 11. The second electrodes 21 are arranged in the image pickup area 19 in plan view.

Next, first connection bodies 4 will be described. A plurality of the first connection bodies 4 are provided, and mechanically and electrically connect respective first electrodes 11 to the corresponding second electrodes 21. The structures of the respective first connection bodies 4 are the same, and thus a single first connection body 4 will be mainly described below.

The first connection body 4 includes a solder portion 29 and a barrier layer 30.

The solder portion 29 is disposed between the first electrode 11 and the second electrode 21. The solder portion 29 is formed of a solder material containing indium (In) and has flexibility for a strain due to thermal stress. Examples of the material of the solder portion 29 include In—Zn alloys, In—Ag alloys, and a material composed of substantially 100% of In. An example of an In alloy is an In—Zn alloy containing 85% to 97.5% by weight of In and 2.5% to 15% by weight of Zn. In particular, an example thereof is an alloy containing 96% by weight of In and 4% by weight of Zn. An example of the In—Ag alloy is an alloy containing 96% of In and 3% of Ag. The solder portion 29 is joined to the barrier layer 30 by melting. The solder portion 29 has a thickness of, for example, 3 to 9 μm.

The barrier layer 30 includes a first barrier layer 31 and a second barrier layer 32.

The first barrier layer 31 is disposed between the solder portion 29 and the first electrode 11. The first barrier layer 31 is provided in order to suppress alloying of the solder portion 29 and the first electrode 11 when the solder portion 29 is melted. The term "alloying" in this case refers to the formation of an alloy having a hardness higher than that of the solder portion 29 as a result of a reaction between the solder portion 29 and the first electrode 11, for example, the formation of $AuIn_2$.

The first barrier layer 31 has a thickness of about 0.1 μm and is formed over the entire surface on the first electrode 11. The first barrier layer 31 has, for example, a layered structure including a Au layer, a Ni layer, and a Ti layer. The material of the first barrier layer 31 is not particularly limited as long as alloying of the solder portion 29 and the first electrode 11 can be suppressed. The first barrier layer 31 may have, for example, a layered structure including a Au layer, a Pt layer, and a Ti layer. The first barrier layer 31 is joined to the first electrode 11 and joined to the solder portion 29. Thus, the first barrier layer 31 suppresses direct contact between the first electrode 11 and the solder portion 29.

The second barrier layer 32 is disposed between the solder portion 29 and the second electrode 21. The second barrier layer 32 is provided in order to suppress alloying of the solder portion 29 and the second electrode 21 when the solder portion 29 is melted. The term "alloying" in this case refers to the formation of an alloy having a hardness higher than that of the solder portion 29 as a result of a reaction between the solder portion 29 and the second electrode 21, for example, the formation of $AuIn_2$.

The second barrier layer 32 has a thickness substantially the same as the thickness of the first barrier layer 31 and is formed over the entire surface on the second electrode 21. The material of the second barrier layer 32 is the same as that of the first barrier layer 31. The second barrier layer 32 is joined to the second electrode 21 and joined to the solder portion 29. Thus, the second barrier layer 32 suppresses direct contact between the second electrode 21 and the solder portion 29. The second connection bodies 5 are formed so as to be adjacent to the first connection bodies 4 each having the above structure.

The second connection bodies 5 are provided in order to mechanically connect the light-receiving device unit 2 to the processing portion 3. The second connection bodies 5 function as spacers that maintain a gap between the surface 10a of the light receiving device unit main body 10 and the surface 20a of the processing portion main body 20 in the step of connecting the light-receiving device unit 2 to the processing portion 3 with molten solder bumps. It is needed that the second connection bodies 5 sufficiently function as spacers that maintain the gap. Therefore, the second connection bodies 5 may be integrated with both the surface 10a of the light-receiving device unit main body 10 and the surface 20a of the processing portion main body 20. Alternatively, the second connection bodies 5 may be integrated with one of the surface 10a and the surface 20a. The second connection bodies 5 are arranged outside the image pickup area 19 in plan view. One or a plurality of second connection bodies 5 are provided. In the present embodiment, the second connection bodies 5 are arranged in four corners of the light-receiving device unit 2. The structures of the second connection bodies 5 are the same, and thus a single second connection body 5 will be mainly described below.

The second connection body 5 includes an alloy portion 33. The alloy portion 33 has a structure in which, in the production of the image pickup device 1, a first metal layer 34 formed on the surface 10a of the light-receiving device unit main body 10, a second metal layer 35 formed on the surface 20a of the processing portion main body 20, and solder bumps 41 and 42 disposed between the metal layers 34 and 35 are alloyed. In the present embodiment, at the time of completion of the production of the image pickup device 1, the first metal layer 34, the second metal layer 35, and the solder bumps 41 and 42 are mixed with each other to form the alloy portion 33.

The first metal layer 34 is formed on the surface 10a of the light-receiving device unit main body 10. The first metal layer 34 may be formed of the same material as the material of the first electrode 11. When the image pickup device 1 is produced, the first metal layer 34 and the first electrode 11 may be simultaneously formed. The thickness of the first metal layer 34 may be the same as the thickness of the first electrode 11. The first metal layer 34 is insulated from the light-receiving devices 18.

The second metal layer 35 is formed on the surface 20a of the processing portion main body 20, and is disposed so as to face the first metal layer 34. The second metal layer 35 may be formed of the same material as the material of the second electrode 21. When the image pickup device 1 is produced, the second metal layer 35 and the second electrode 21 may be simultaneously formed. The thickness of the second metal layer 35 may be the same as the thickness of the second electrode 21. The second metal layer 35 is insulated from the processing circuit 22.

The solder bumps 41 and 42 each contain a solder composed of a material having a melting point equal to or higher than the melting point of the solder portion 29 and a hardness higher than that of the solder portion 29. For example, the solder bumps 41 and 42 are melted by being heated together with solder bumps 43 and 44 for forming the solder portion 29, and mixed with the first metal layer 34 and the second metal layer 35. As a result, the alloy portion 33 is formed. In the present embodiment, the solder bumps 41 and 42 are alloyed with Au contained in each of the first metal layer 34 and the second metal layer 35 to form the alloy portion 33. In the present embodiment, the whole of the second connection body 5 is formed of the alloy portion 33. The alloy portion 33 has a melting point equal to or higher than that of the solder portion 29 and a hardness higher than that of the solder portion 29.

For example, the solder bumps 41 and 42 each contain Sn. For example, the solder bumps 41 and 42 are melted by being heated together with the solder bumps 43 and 44 for forming the solder portion 29, and mixed with the first metal layer 34 and the second metal layer 35. As a result, the alloy portion 33 is formed, in the present embodiment, indium (in) contained in the solder bumps 41 and 42 is alloyed with Au contained in each of the first metal layer 34 and the second metal layer 35 to form the alloy portion 33. In the present embodiment, the whole of the second connection body 5 is formed of the alloy portion 33. The alloy portion 33 has a high melting point and a high hardness as compared with the solder portion 29. Alternatively, one of the solder bump 41 and the solder bump 42 may contain Sn. The second connection body 5 may contain Sn in a part thereof, and a thickness of the part containing Sn may be 1% or more and less than 30% of the total thickness of the second connection body. For example, the second connection body 5 may have the following structure. The first metal layer may be a multilayer film including Ti, Ni, and Au layers and may have a total thickness of 1 µm. The solder bump 41 may be formed of an alloy layer composed of Au 80%-Sn 20% and may have a thickness of 1 µm. The solder bump 42 may be formed of a Au layer having a thickness of 5 µm. The second metal layer may be a multilayer film including Ti, Ni, and Au layers and may have a total thickness of 0.5 µm. The resulting alloy portion 33 formed in this case is composed of an alloy having a composition between Au 80%-Sn 20% and Au 100%, and has a high melting point and a high hardness as compared with the solder portion 29.

For example, the solder bumps 41 and 42 are each formed of the same material as the material of the solder portion 29, and contain indium (In). For example, the solder bumps 41 and 42 are melted by being heated together with the solder bumps 43 and 44 for forming the solder portion 29, and mixed with the first metal layer 34 and the second metal layer 35. As a result, the alloy portion 33 is formed, in the present embodiment, $AuIn_2$ which is formed by alloying In contained in the solder bumps 41 and 42 with Au contained in each of the first metal layer 34 and the second metal layer 35 forms the alloy portion 33. In the present embodiment, the whole of the second connection body 5 is formed of the alloy portion 33. The alloy portion 33 is made harder than the solder portion 29.

When the image pickup device 1 is produced, parts of the solder bumps 41 and 42 may not react with the first metal layer 34 and the second metal layer 35. As a result, these parts of the solder bumps 41 and 42 may be left in the second connection body 5. When the image pickup device 1 is produced, a part of the first metal layer 34 may not react with the solder bumps 41 and 42. As a result, this part of the first metal layer 34 may be left in the second connection body 5. Similarly, when the image pickup device 1 is produced, a part of the second metal layer 35 may not react with the solder bumps 41 and 42. As a result, this part of the second metal layer 35 may be left in the second connection body 5.

The second connection body 5 is joined to each of the surface 10a of the light-receiving device unit main body 10 and the surface 20a of the processing portion main body 20, and insulated from the first electrode 11 and the second electrode 21. Therefore, the second connection body 5 does not contribute to the electrical connection between the light-receiving device unit 2 and the processing portion 3.

In plan view, the second connection body 5 is formed so as to have a size different from that of the first connection body 4. In the present embodiment, the second connection body 5 has a circular shape having a diameter of about 100 µm in plan view. On the other hand, in the present embodiment, the first connection body 4 is formed so as to have a circular shape having a side of about several micrometers to several tens of micrometers in plan view. On a cross section orthogonal to the facing direction D1, the cross-sectional area of the second connection body 5 and the cross-sectional area of the first connection body 4 are different from each other. In the present embodiment, the cross-sectional area of the second connection body 5 is larger than the cross-sectional area of the first connection body 4.

A pitch P3 between a second connection body 5 and a first connection body 4 that is adjacent to the second connection body 5 at the closest position is larger than the pitch P1 (P2) at which the first connection bodies 4 are arranged. Specifically, the relationships P3>P1 and P3>P2 are satisfied. The second connection body 5 functions as a recognition portion that aids recognition of relative positions of the light-receiving device unit 2 and the processing portion 3.

(Description of Method for Producing Image Pickup Device)

Next, methods for producing the image pickup device will be described. First, the method for producing the light-receiving device unit will be described.

(Steps of Producing Light-Receiving Device Unit)

Figure 5A:
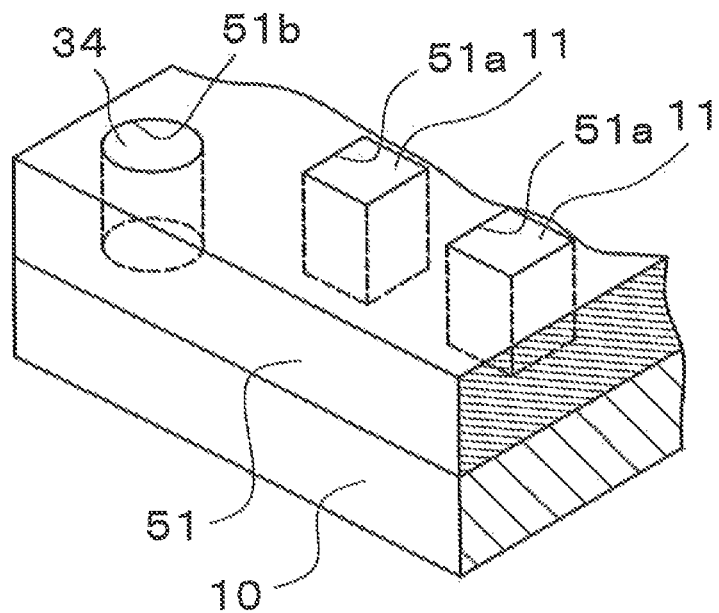
FIG. 5A is a perspective view of the state shown in part C of FIG. 4, and shows a state where a part of a light-receiving device unit and a part of a resist layer are broken.
Figure 5B:
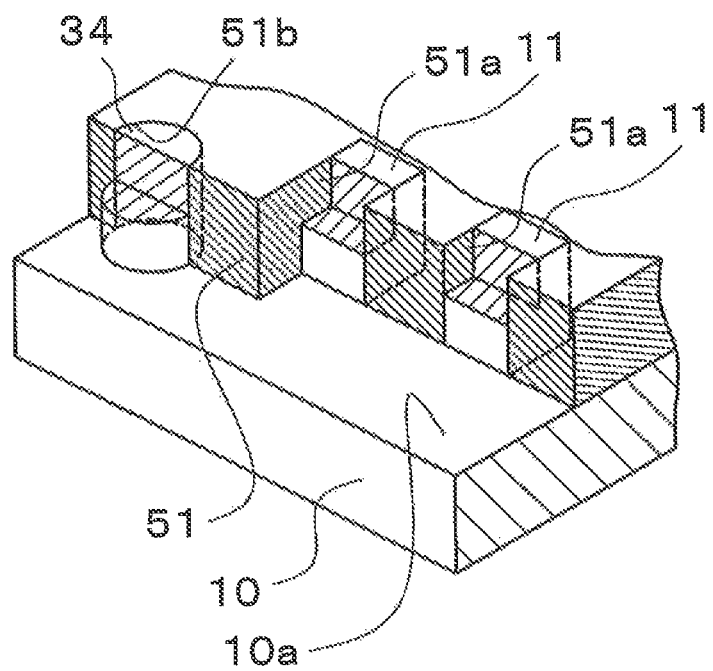
FIG. 5B is a perspective view of the state shown in part C of FIG. 4, and shows a state where parts of first electrodes and a part of a first metal layer are broken.
Figure 6:
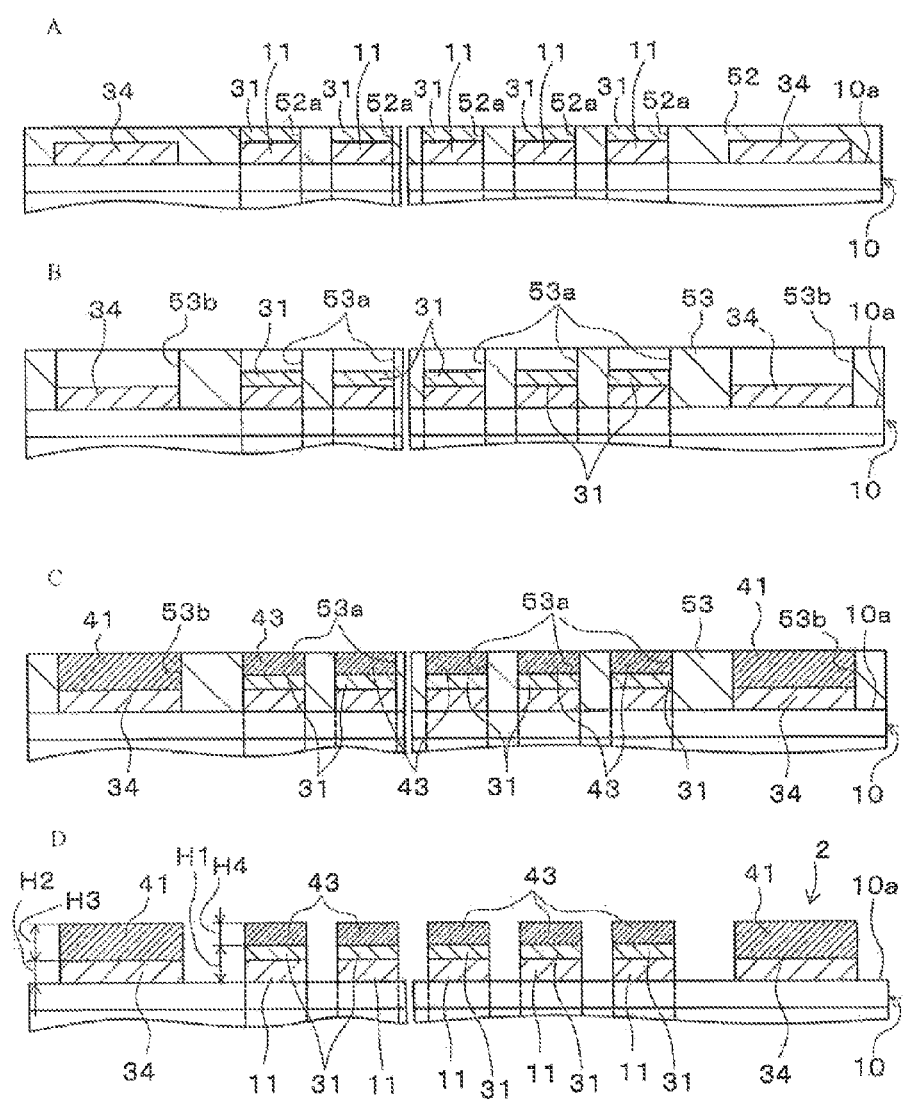
FIG. 6 includes schematic views illustrating steps of producing a light-receiving device unit, and parts A to D show production steps subsequent to the production step shown in part D of FIG. 4.

FIG. 4 includes schematic views illustrating steps of producing a light-receiving device unit 2, and part A of FIG. 4 to part D of FIG. 4 sequentially show steps of producing the light-receiving device unit 2. FIGS. 5A and 5B are each a perspective view of the state shown in part C of FIG. 4. FIG. 6 includes schematic views illustrating steps of producing the light-receiving device unit 2, and part A of FIG. 6 to part D of FIG. 6 show production steps subsequent to the production step shown in part D of FIG. 4.

As shown in part A of FIG. 4, in the steps of producing the light-receiving device unit 2, first, a light-receiving device unit main body 10 is prepared.

Next, as shown in part B of FIG. 4, a resist layer 51 is formed on a surface 10a, of the light-receiving device unit main body 10. The resist layer 51 is formed by, for example, applying an uncured resist composition onto the surface 10a with a roll coater, curing the resulting resist film, and then etching the resist film so as to form a pattern of the resist layer 51. Openings 51a and 51b are formed in the resist layer 51. The openings 51a are formed, on the surface 10a, at respective positions facing a plurality of light-receiving devices 18.

The openings 51b are formed in four corners of the light receiving device unit main body 10 outside an image pickup area 19 of the light-receiving device unit main body 10.

Next, as shown in part C of FIG. 4, FIG. 5A, and FIG. 5B, a AuZn-based electrode and a Au covering layer are formed in each of the openings 51a and the openings 51b by evaporation method, for example. As a result, a first electrode 11 is formed in each of the openings 51a on the surface 10a, and a first metal layer 34 is formed in each of the openings 51b on the surface 10a. Part C of FIG. 4, FIG. 5A, and FIG. 5B are views showing the same structure viewed from different perspectives. More specifically, part C of FIG. 4 shows a side surface of the light-receiving device unit main body 10 and cross sections of the resist layer 51, the first electrodes 11, and the first metal layers 34 that are provided on the light-receiving device unit main body 10. FIG. 5A shows a state where parts of the light-receiving device unit 10 and the resist layer 51 are broken, and a state where the first electrodes 11 and the first metal layer 34 are each embedded in the resist layer 51. Furthermore, FIG. 5B shows a state where a part of the resist layer 51 is broken so that the surface 10a of the light-receiving device unit main body 10, the first electrodes 11, and the first metal layer 34 are exposed. FIG. 5B also shows a state where parts of the first electrodes 11 and the first metal layer 34 are broken.

Next, the resist layer 51 is removed, and a resist layer 52 is formed as shown in part D of FIG. 4. The resist layer 52 is formed by, for example, applying an uncured resist composition onto the surface 10a with a roll coater, curing the resulting resist film, and then etching the resist film so as to form a pattern of the resist layer 52. A plurality of openings 52a are formed in the resist layer 52. The plurality of openings 52a are formed so as to expose respective surfaces of the plurality of first electrodes 11. The resist layer 52 covers each of the first metal layers 34.

After the resist layer 52 is formed, as shown in part A of FIG. 6, a first barrier layer 31 is formed in each of the openings 52a by evaporation method, for example. Thus, the first barrier layer 31 is formed on each of the surfaces of the first electrodes 11.

Next, the resist layer 52 is removed, and a resist layer 53 is formed as shown in part B of FIG. 6. The resist layer 53 is formed by, for example, applying an uncured resist composition onto the surface 10a with a roll coater, curing the resulting resist film, and then etching the resist film so as to form a pattern of the resist layer 53. A plurality of openings 53a and a plurality of openings 53b are formed in the resist layer 53. The openings 53a are formed so as to expose respective surfaces of the plurality of first barrier layers 31. The openings 53b are formed so as to expose respective surfaces of the plurality of first metal layers 34.

After the resist layer 53 is formed, as shown in part C of in FIG. 6, solder bumps 43 and solder bumps 41 are respectively formed in the openings 53a and the openings 53b by evaporation method, for example. Furthermore, only the openings 53b are opened by using a metal mask (not shown), for example. Then, solder bumps are additionally formed only in the respective openings 53b. Thus, the solder bumps 43 are formed on the surfaces of the first barrier layers 31 in the openings 53a, and the solder bumps 41 are formed on the surfaces of the first metal layers 34 in the openings 53b.

After the solder bumps 41 and 43 are formed, as shown in part D of FIG. 6, the resist layer 53 is removed, thus producing the light-receiving device unit 2. In this case, a sum H1 of a thickness of a first electrode 11 and a thickness of a first barrier layer 31 is larger than a thickness H2 of a first metal layer 34. In addition, a thickness H3 of a solder bump 41 is larger than a thickness H4 of a solder bump 43.

(Steps of Producing Processing Portion)

Figure 7:
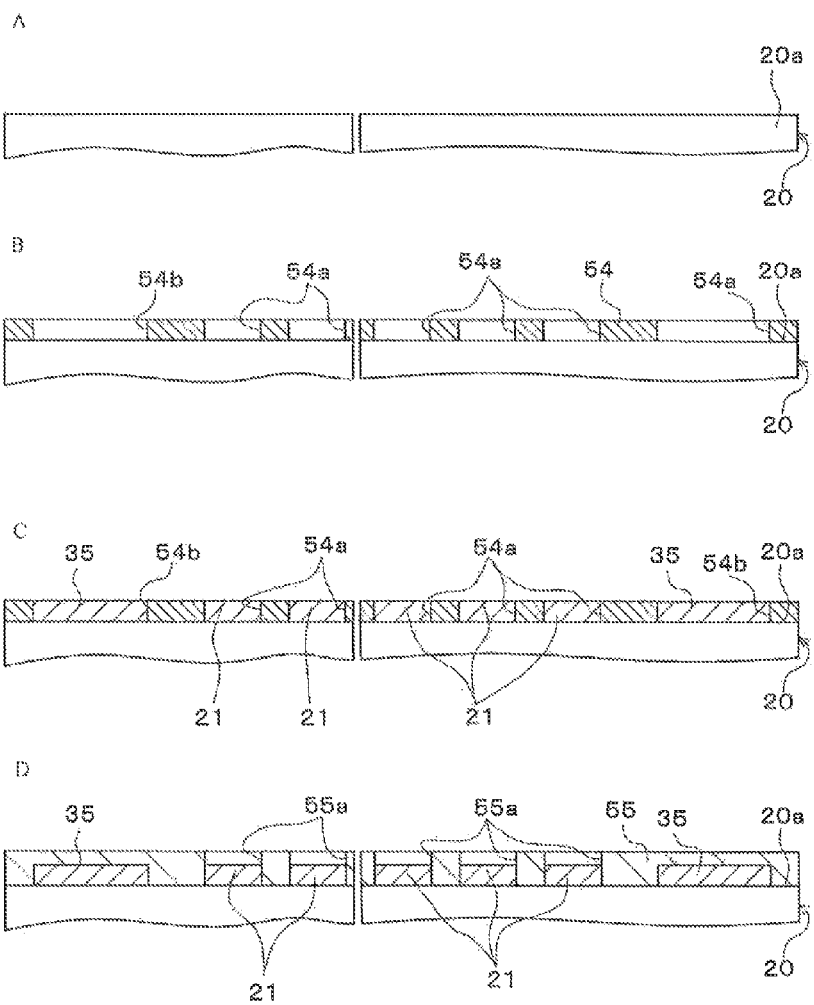
FIG. 7 includes schematic views illustrating steps of producing a processing portion, and parts A to D sequentially show steps of producing the processing portion.
Figure 8:
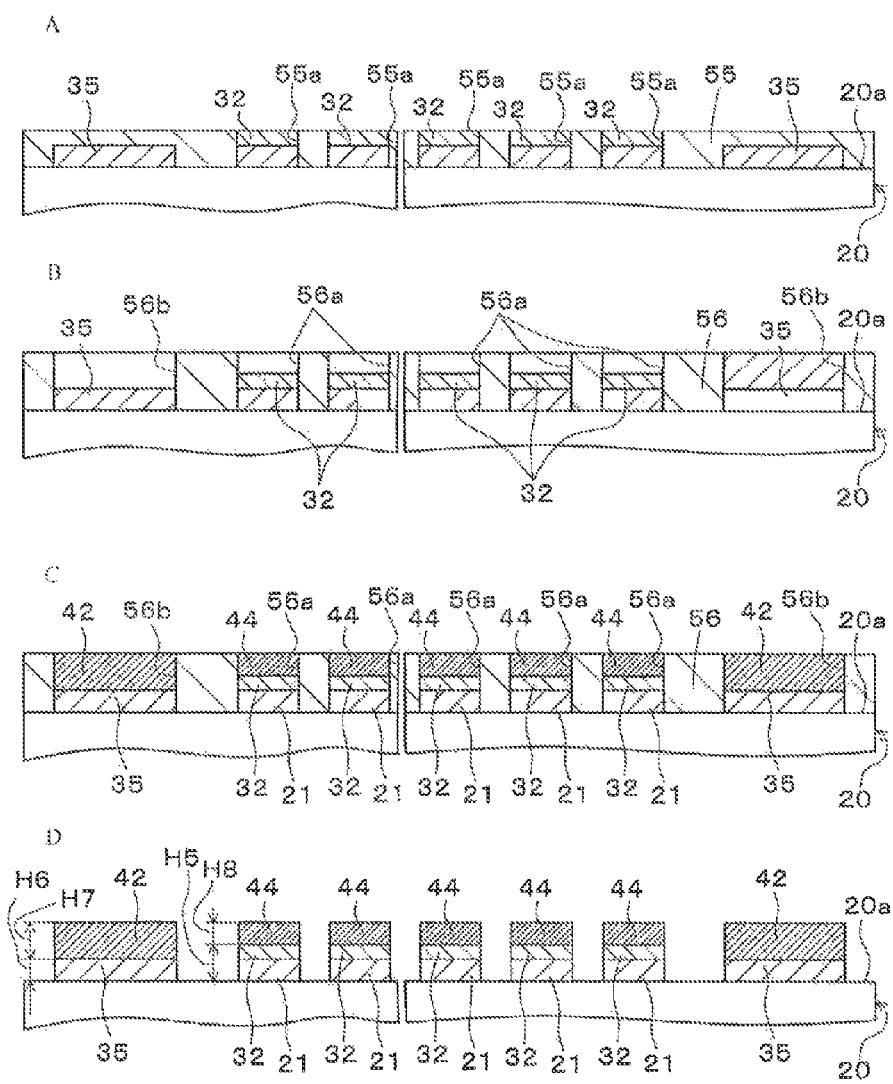
FIG. 8 includes schematic views illustrating steps of producing a processing portion, and parts A to D show production steps subsequent to the production step shown in part D of FIG. 7.

FIG. 7 includes schematic views illustrating steps of producing a processing portion 3, and part A to part D of FIG. 7 sequentially show steps of producing the processing portion 3. FIG. 8 includes schematic views illustrating steps of producing the processing portion 3, and parts A to D of FIG. 8 show production steps subsequent to the production step shown in part D of FIG. 7.

As shown in FIG. 7A, in the steps of producing the processing portion 3, first, a processing portion main body 20 is prepared.

Next, as shown in part B of FIG. 7, a resist layer 54 is formed on a surface 20a of the processing portion main body 20. The resist layer 54 is formed by, for example, applying an uncured resist composition onto the surface 20a with a roll coater, curing the resulting resist film, and then etching the resist film so as to form a pattern of the resist layer 54. Openings 54a and 54b are formed in the resist layer 54. The openings 54a are formed at respective positions where second electrodes 21 are formed on the surface 20a of the processing portion main body 20. The openings 54b are formed in four corners of the processing portion main body 20.

Next, as shown in part C of FIG. 7, a Au layer is firmed in each of the openings 54a and the openings 54b by evaporation method, for example. As a result, a second electrode 21 composed of the Au layer is formed in each of the openings 54a on the surface 20a, and a second metal layer 35 composed of the Au layer is formed in each of the openings 54b on the surface 20a.

Next, the resist layer 54 is removed, and a resist layer 55 is formed as shown in part D of FIG. 7. The resist layer 55 is formed by, for example, applying an uncured resist composition onto the surface 20a with a roll coater, curing the resulting resist film, and then etching the resist film so as to form a pattern of the resist layer 55. A plurality of openings 55a are formed in the resist layer 55. The plurality of openings 55a are formed so as to expose respective surfaces of the plurality of second electrodes 21. The resist layer 55 covers each of the second metal layers 35.

After the resist layer 55 is formed, as shown in part A of FIG. 8, a second barrier layer 32 is formed in each of the openings 55a by evaporation method, for example. Thus, the second barrier layer 32 is formed on each of the surfaces of the second electrodes 21.

Next, the resist layer 55 is removed, and a resist layer 56 is formed as shown in part B of FIG. 8. The resist layer 56 is formed by, for example, applying an uncured resist composition onto the surface 20a with a roll coater, curing the resulting resist film, and then etching the resist film so as to form a pattern of the resist layer 56. A plurality of openings 56a and a plurality of openings 56b are formed in the resist layer 56. The openings 56a are formed so as to expose respective surfaces of the plurality of second barrier layers 32. The openings 56b are formed so as to expose respective surfaces of the plurality of second metal layers 35.

After the resist layer 56 is thrilled, as shown in part C of in FIG. 8, solder bumps 44 and solder bumps 42 are respectively formed in the openings 56a and the openings 56b by evaporation method, for example. Furthermore, only the openings 56b are opened by using a metal mask (not shown), for example. Then, solder bumps are additionally formed only in the respective opening 56b. Thus, the solder bumps 44 are formed on the surfaces of the first barrier layers 31 in the openings 56a, and the solder bumps 42 are formed on the surfaces of the second metal layers 35 in the openings 56b.

After the solder bumps 42 and 44 are formed, as shown in part D of FIG. 8, the resist layer 56 is removed, thus producing the processing portion 3. In this case, a sum H5 of a thickness of a second electrode 21 and a thickness of a second barrier layer 32 is larger than a thickness H6 of a second metal layer 35. In addition, a thickness H7 of a solder bump 42 is larger than a thickness H8 of a solder bump 44.

(Steps of Connecting Light-Receiving Device Unit to Processing Portion)

Figure 9:
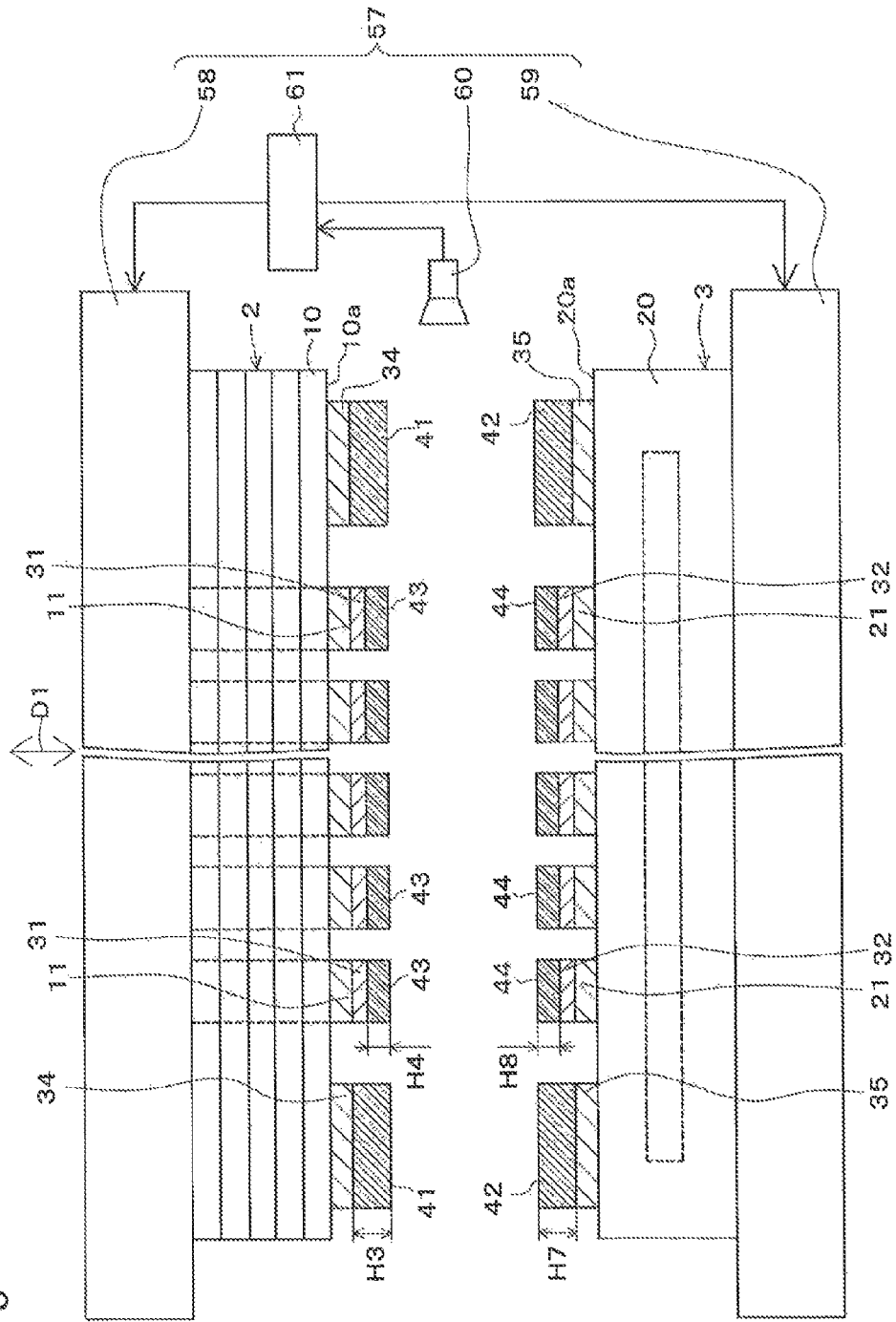
FIG. 9 is a schematic partially cross-sectional lateral view illustrating a step of connecting a light-receiving device unit to a processing portion.
Figure 10:
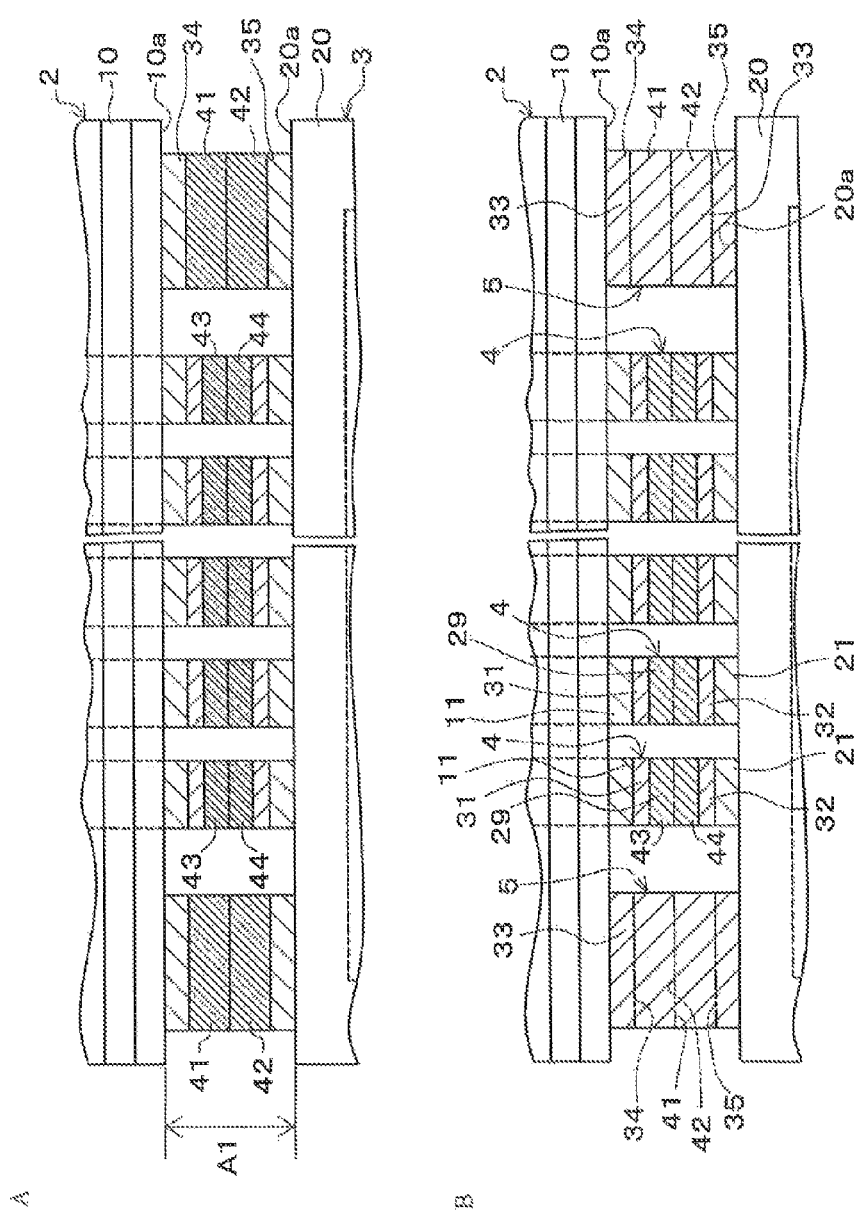
FIG. 10 includes schematic partially cross-sectional lateral views illustrating steps of connecting a light-receiving device unit to a processing portion, and parts A and B show steps subsequent to the step shown in FIG. 9.

FIG. 9 is a schematic partially cross-sectional lateral view illustrating a connection step of connecting a light-receiving device unit 2 to a processing portion 3. FIG. 10 includes schematic partially cross-sectional lateral views illustrating connection steps, and parts A and B of FIG. 10 show steps subsequent to the step shown in FIG. 9.

As shown in FIG. 9, in the steps of connecting a light-receiving device unit 2 to a processing portion 3, first, the light-receiving device unit 2 is held by a tool 58 of a chip bonder 57, and the processing portion 3 is held by a stage 59 of the chip bonder 57. The chip bonder 57 includes a driving mechanism that can change relative positions of the tool 58 and the stage 59. The chip bonder 57 includes a camera 60 and a control unit 61.

Subsequently, the surface 10a of the light-receiving device unit 2 and the surface 20a of a processing portion main body 20 are allowed to face each other by the chip bonder 57 in a facing direction D1. In this step, the light-receiving device unit 2 and the processing portion 3 are arranged with a predetermined distance therebetween in the facing direction D1. Furthermore, in this step, relative positions of the light-receiving device unit 2 and the processing portion 3 in a direction orthogonal to the facing direction D1 are captured by the camera 60.

Data of the camera 60 is output to the control unit 61. The control unit 61 recognizes relative positions of first metal layer 34 of the light-receiving device unit 2 and second metal layers 35 of the processing portion 3. The control unit 61 then adjusts relative positions of the tool 58 and the stage 59 so that the position of each of the first metal layers 34 and the position of the corresponding second metal layer 35 directly face each other in the facing direction D1. In this case, a total thickness (H4+H8) of solder bumps 43 and 44 arranged between a first barrier layer 31 and a second barrier layer 32 that face each other is different from a total thickness (H3+H7) of solder bumps 41 and 42 arranged between a first metal layer 34 and a second metal layer 35 that face each other. In the present embodiment, the relationship H3+H7>H4+H8 is satisfied.

The chip bonder 57 heats and melts the solder bumps 41 and 43 disposed on the light-receiving device unit 2 and the solder bumps 42 and 44 disposed on the processing portion 3 by using a heater (not shown), for example. In this case, the solder bumps 41 to 44 are each heated to a temperature exceeding the melting point of the solder bumps 43 and 44. In the present embodiment, the bumps 41 to 44 are heated to about 250° C.

Subsequently, the distance between the tool 58 and the stage 59 is reduced. As a result, as shown in part A of FIG. 10, the solder bumps 41 and 43 of the light-receiving device unit 2 and the corresponding solder bumps 42 and 44 of the processing portion 3 are respectively brought into contact with each other and pressed. In this case, a distance A1 between the surface 10a of the light-receiving device unit main body 10 and the surface 20a of the processing portion main body 20 is about 8 μm. However, since the distance A1 is very small, the actual value of the distance A1 determined by the setting of the relative positions of the tool 58 and the stage 59 is not exactly 8 μm and the distance A1 includes an error, though the error is very small.

In this case, as shown in part B of FIG. 10, each of the first metal layers 34 contacts the corresponding solder bumps 41 and 42, and the first metal layer 34 and the solder bumps 41 and 42 are alloyed with each other. In addition, each of the second metal layers 35 contacts the corresponding solder bumps 41 and 42, and the second metal layer 35 and the solder bumps 41 and 42 are alloyed with each other. Thus, alloy portions 33, i.e., second connection bodies 5 are formed.

The alloy portions 33 of the second connection bodies 5 are harder than the solder bumps 41 to 44. Therefore, the second connection bodies 5 function as spacers between the surface 10a of the light-receiving device unit main body 10 and the surface 20a of the processing portion main body 20. In this state, each of the solder bumps 43 of the light-receiving device unit 2 contacts the corresponding solder bump 44 of the processing portion 3 to form solder portions 29. The solder portions 29 each connect the corresponding first barrier layer 31 to the second barrier layer 32. Thus, first connection bodies 4 are formed. Each of the solder portions 29 is sandwiched between the first barrier layer 31 and the second barrier layer 32 and does not contact the first electrode 11 or the second electrode 21.

Subsequently, heating by the chip bonder 57 is stopped. Consequently, the first connection bodies 4, the second connection bodies 5, etc. are cooled to room temperature of about 20° C., and an image pickup device 1 is produced. The image pickup device 1 is then used in an atmosphere of several tens of degrees below zero, as described above.

As described above, in the image pickup device according to an embodiment of the present invention, the first connection bodies 4 each include the solder portion 29 and the barrier layer 30. The second connection bodies 5 each include an alloy portion composed of a material having a melting point equal to or higher than the melting point of the first connection bodies and a hardness higher than the hardness of the first connection bodies.

The first connection bodies 4 each include the barrier layer 30 so as to satisfy the above feature. Accordingly, it is possible to suppress alloying of the solder portion 29 with the first electrode 11 and the second electrode 21, and to suppress the formation of an alloy harder than the solder portion 29. In addition, since the first connection bodies 4 each include the soft solder portion 29 containing indium, the first connection bodies 4 can withstand a large strain due to heat. Accordingly, it is possible to reliably suppress peeling of the solder portion 29 from each of the first electrode 11 and the second electrode 21 (the light-receiving device unit main body 10 and the processing portion main body 20).

Therefore, regarding the resulting image data, occurrence of an image defect such as a missing pixel can be suppressed. Furthermore, the alloy portion 33 of each of the second connection bodies 5 is harder than the solder portion 29. Thus, the second connection bodies 5 function as spacers between the light-receiving device unit 2 and the processing portion 3. With this structure, in the step of connecting the light-receiving device unit 2 to the processing portion 3 with the molten solder bumps 41 to 44, the second connection bodies 5 serving as the spacers may prevent a gap between the light-receiving device unit 2 and the processing portion 3 from becoming excessively narrow.

Accordingly, in the step of connecting the light-receiving device unit 2 to the processing portion 3, the molten solder bumps 43 and 44 for forming the solder portions 29 of the first connection bodies 4 are not easily flattened between the light-receiving device unit 2 and the processing portion 3. As a result, short-circuiting caused by adjacent solder portions 29 being joined can be suppressed.

In the image pickup device according to an embodiment of the present invention, the first connection bodies 4 each include the solder portion 29 and the barrier layer 30. In addition, the second connection bodies 5 each contain, in a part or the whole area thereof, Sn and one selected from the group consisting of Au, Ag, Cu, Zn, Ni, and Al.

The first connection bodies 4 each include the barrier layer 30 so as to satisfy the above feature. Accordingly, it is possible to suppress alloying of the solder portion 29 with the first electrode 11 and the second electrode 21, and to suppress the formation of an alloy harder than the solder portion 29. In addition, since the first connection bodies 4 each include the soft solder portion 29 containing indium, the first connection bodies 4 can withstand a large strain due to heat. Accordingly, it is possible to reliably suppress peeling of the solder portion 29 from each of the first electrode 11 and the second electrode 21 (the light-receiving device unit main body 10 and the processing portion main body 20). Therefore, regarding the resulting image data, occurrence of an image defect such as a missing pixel can be suppressed. Furthermore, the alloy portion 33 of each of the second connection bodies 5 is harder than the solder portion 29. Thus, the second connection bodies 5 function as spacers between the light-receiving device unit and the processing portion 3. With this structure, in the step of connecting the light-receiving device unit 2 to the processing portion 3 with the molten solder bumps 41 to 44, the second connection bodies 5 serving as the spacers may prevent a gap between the light-receiving device unit 2 and the processing portion 3 from becoming excessively narrow. Accordingly, in the step of connecting the light-receiving device unit 2 to the processing portion 3, the molten solder bumps 43 and 44 for forming the solder portions 29 of the first connection bodies 4 are not easily flattened between the fight-receiving device unit 2 and the processing portion 3. As a result, short-circuiting caused by adjacent solder portions 29 being joined can be suppressed.

In the image pickup device according to an embodiment of the present invention, the first connection bodies 4 each include the solder portion 29 and the barrier layer 30. The second connection bodies 5 each include the alloy portion 33 formed by alloying a metal the same as the metal contained in the first electrode 11 and the second electrode 21 with a solder material containing indium.

The first connection bodies 4 each include the barrier layer 30 so as to satisfy the above feature. Accordingly, it is possible to suppress alloying of the solder portion 29 with the first electrode 11 and the second electrode 21, and to suppress the formation of an alloy harder than the solder portion 29. In addition, since the first connection bodies 4 each include the soft solder portion 29 containing indium, the first connection bodies 4 can withstand a large strain due to heat. Accordingly, it is possible to reliably suppress peeling of the solder portion 29 from each of the first electrode 11 and the second electrode 21 (the light-receiving device unit main body 10 and the processing portion main body 20). Therefore, regarding the resulting image data, occurrence of an image defect such as a missing pixel can be suppressed.

Furthermore, the alloy portion 33 of each of the second connection bodies 5 is formed by alloying a metal the same as the metal contained in the first electrode 11 and the second electrode 21 (the first metal layer 34 and the second metal layer 35) with solder bumps 41 and 42 containing indium, and is harder than the solder portion 29. Thus, the second connection bodies 5 function as spacers between the light-receiving device unit 2 and the processing portion 3. With this structure, in the step of connecting the light-receiving device unit 2 to the processing portion 3 with the molten solder bumps 41 to 44, the second connection bodies 5 serving as the spacers may prevent a gap between the light-receiving device unit 2 and the processing portion 3 from becoming excessively narrow.

Accordingly, in the step of connecting the light-receiving device unit 2 to the processing portion 3, the molten solder bumps 43 and 44 for forming the solder portions 29 of the first connection bodies 4 are not easily flattened between the light-receiving device unit 2 and the processing portion 3. As a result, short-circuiting caused by adjacent solder portions 29 being joined can be suppressed. Thus, the occurrence of defective electrical contact from the light-receiving device unit 2 to the processing portion 3 can be suppressed. In addition, the time and labor necessary for forming the second connection bodies 5 are small, and thus the image pickup device 1 can be easily produced and the production cost can be reduced.

Specifically, in a step of forming first electrodes 11 on a surface 10*a* of a light-receiving device unit main body 10, first metal layers 34 which are insulated from light-receiving devices 18 are also formed, simultaneously (refer to part C of FIG. 4). A first barrier layer 31 is formed only on each of the first electrodes 11 out of the first electrodes 11 and the first metal layers 34 (refer to part A of FIG. 6). In a step of forming second electrodes 21 on a surface 20*a* of a processing portion main body 20, second metal layers 35 are also formed, simultaneously (refer to part C of FIG. 7). A second barrier layer 32 is formed only on each of the second electrodes 35 out of the second electrodes 21 and the second metal layers 35 (refer to part A of FIG. 8). In a step of connecting the light-receiving device unit 2 to the processing portion 3, each of the first barrier layers 31 is connected to the corresponding second barrier layer 32 using molten solder bumps 43 and 44, thus forming first connection bodies 4. Simultaneously, each of the first metal layers 34 is connected to the corresponding second metal layer 35 using molten solder bumps 41 and 42. As a result, the solder bumps 41 and 42 are alloyed with the corresponding first metal layer 34 and second metal layer 35 to form second connection bodies 5 including alloy portions 33. Specifically, the structure of each of the second connection bodies 5 corresponds to a structure in which the barrier layer 30 of each of the first connection bodies 4 is eliminated. Accordingly, the first connection bodies 4 and the second connection bodies 5 can be easily separately formed by using the slight difference between the operation in which the barrier layers 30 are formed on portions where the first connection bodies 4 are to be formed and the operation in which the barrier layers 30 are not formed on portions where the second connection bodies 5 are to be formed.

Furthermore, by melting the solder bumps 43 and 44 for forming the first connection bodies 4 and the solder bumps 41 and 42 for forming the second connection bodies 5 at the same time, the first connection bodies 4 and the second connection bodies 5 can be formed, simultaneously. Therefore, the image pickup device 1 can be easily produced. In addition, since the second connection bodies 5 function as spacers between the light-receiving device unit 2 and the processing portion 3, special spacers need not be separately provided and the production cost can be reduced.

Accordingly, it is possible to realize an image pickup device 1 having following features. That is, the image pickup device 1 in the embodiment may withstand a large temperature change, may accurately and reliably output a current from each light-receiving device 18 to a processing portion 3, may be easily produced, and is inexpensive.

In the image pickup device according to an embodiment of the present invention, the pitch P3 between a first connection body 4 and a second connection body 5 is larger than the pitch P1 at which first connection bodies 4 adjacent to each other are arranged.

By arranging each of the second connection bodies 5 so as to be sufficiently separated from the first connection bodies 4 as described above, in the step of connecting the light-receiving device unit 2 to the processing portion 3, it is possible to suppress the joining of solder bumps 41 and 42 melted for forming the second connection bodies 5 to solder bumps 43 and 44 melted for forming the first connection bodies 4.

In the image pickup device according to an embodiment of the present invention, a plurality of light-receiving devices 18 are arranged in a predetermined image pickup area 19 and second connection bodies 5 are arranged outside the image pickup area 19.

By arranging the second connection bodies 5 outside the image pickup area 19 where the light-receiving devices 18 are arranged as described above, in the step of connecting the light-receiving device unit 2 to the processing portion 3, it is possible to suppress the contact between solder bumps 41 and 42 melted for forming the second connection bodies 5 and solder bumps 43 and 44 melted for forming the first connection bodies 4. Accordingly, in the step of connecting the light-receiving device unit 2 to the processing portion 3 with a solder, it is not necessary to exactly position the light-receiving device unit 2 and the processing portion 3 for the purpose of suppressing contact between the solder bumps 41 and 42 for forming the second connection bodies 5 and the solder bumps 43 and 44 of the first connection bodies 4. Thus, the image pickup device 1 can be more easily produced.

In the image pickup device according to an embodiment of the present invention, on across section orthogonal to the facing direction D1, the cross-sectional area of each of the second connection bodies 5 is different from the cross-sectional area of each of the first connection bodies 4.

As described in the present embodiment, when the cross-sectional area of each of the second connection bodies 5 is larger than the cross-sectional area of each of the first connection bodies 4, the second connection bodies 5 can be formed so as to have a wider size. With this structure, the alloy portions 33 of the second connection bodies 5 can be formed so as to have a larger size. Thus, the alloy portions 33 can more reliably function as spacers between the light-receiving device unit 2 and the processing portion 3.

In the image pickup device according to an embodiment of the present invention, a total thickness (H4+H8) of solder bumps 43 and 44 arranged between the first barrier layer 31 and the second barrier layer 32 is different from a total thickness (H3+H7) of solder bumps 41 and 42 arranged between the first metal layer 34 and the second metal layer 35.

As described in the present embodiment, the total thickness (H3+H7) of the solder bumps 41 and 42 arranged between the first metal layer 34 and the second metal layer 35 can be larger than the total thickness (H4+H8) of the solder bumps 43 and 44 arranged between the first barrier layer 31 and the second barrier layer 32. With this structure, the length of the alloy portion 33 formed by alloying the first metal layer 34 and the second metal layer 35 with the solder bumps 41 and 42 can be made long. Accordingly, the alloy portions 33 can more reliably function as spacers between the light-receiving device unit 2 and the processing portion 3.

In the image pickup device according to an embodiment of the present invention, in the step of connecting the light-receiving device unit 2 to the processing portion 3, the first metal layers 34 and the second metal layers 35 are provided as recognition portions that aid recognition of relative positions of the light-receiving device unit 2 and the processing portion 3.

In this case, in the step of connecting the light-receiving device unit 2 to the processing portion 3, the light-receiving device unit 2 and the processing portion 3 can be positioned by using the first metal layers 34 and the second metal layers 35 as recognition portions. Accordingly, each of the first electrodes 11 of the light-receiving device unit 2 and the corresponding second electrode 21 of the processing portion 3 can be accurately positioned, and connected to each other with a solder. Furthermore, additional recognition portions that aid positioning of the light-receiving device unit 2 and the processing portion 3 need not be separately provided, and thus the time, labor, and cost necessary for producing the image pickup device 1 can be further reduced.

In the image pickup device according to an embodiment of the present invention, in the steps of producing the image pickup device 1, the solder bumps 41 and 43 and solder bumps 42 and 44 are respectively formed on the light-receiving device unit 2 and the processing portion 3. However, the structure is not limited thereto. For example, solder bumps may be formed only on the light-receiving device unit 2 or the processing portion 3, and in this state, the light-receiving device unit 2 may be connected to the processing portion 3 with the solder bumps.

In the image pickup device according to an embodiment of the present invention, the second connection bodies 5 are arranged outside the image pickup area 19 in plan view. However, the structure is not limited thereto. For example, the second connection bodies 5 may be arranged inside the image pickup area 19 in plan view.

In the image pickup device according to an embodiment of the present invention, on a cross section orthogonal to the facing direction D1, the cross-sectional area of each of the second connection bodies 5 is larger than the cross-sectional area of each of the first connection bodies 4. However, the structure is not limited thereto. For example, on a cross section orthogonal to the facing direction D1, the cross-sectional area of each of the second connection bodies 5 may be smaller than the cross-sectional area of each of the first connection bodies 4. In the embodiment described above, in the step of connecting the light-receiving device unit 2 to the processing portion 3, the alloy portions 33 are formed while expanding as a result of alloying of a solder material with a metal material. Therefore, by making the cross-sectional area of each of the second connection bodies 5 smaller than the cross-sectional area of each of the first connection bodies 4, the amount of volume expansion due to alloying can be decreased. As a result, the occurrence of the contact of the second connection bodies 5 with the first connection bodies 4 can be more reliably suppressed.

In the image pickup device according to an embodiment of the present invention, the total thickness (H3+H7) of solder bumps 41 and 42 arranged between a first metal layer 34 and a second metal layer 35 is larger than the total thickness (H4+H8) of solder bumps 43 and 44 arranged between a first barrier layer 31 and a second barrier layer 32. However, the structure is not limited thereto. For example, the relationship H3+H7<H4+H8 may be satisfied. In this case, an alloy portion 33 may be prevented from becoming excessively large, and contact of the alloy portion 33 with a first connection body 4 can be suppressed.

In the image pickup device according to an embodiment of the present invention, the processing portion 3 converts a current from the light-receiving device unit 2 to a voltage, and outputs the voltage to a CPU through an A/D converter provided outside the case 6. However, the structure is not limited thereto. For example, the processing portion 3 may include an A/D converter and a CPU.

It is to be understood that the embodiments disclosed herein are only illustrative and not restrictive in all aspects. It is intended that the scope of the present invention is not defined by the description above but defined by the claims described below, and includes equivalents of the claims and all modifications within the scope of the claims.

The invention claimed is:

1. An image pickup device comprising;
a light-receiving device unit including a light-receiving device unit main body including a plurality of light-receiving devices and a plurality of first electrodes formed on a surface of the light-receiving device unit main body so as to correspond to the light-receiving devices, each of the light-receiving devices outputting a current based on intensity of received light;
a processing portion including a plurality of second electrodes that face the first electrodes, and a processing portion main body including a surface having the second electrodes thereon, the processing portion main body processing the current;
a plurality of first connection bodies that connect the first electrodes to the corresponding second electrodes; and
a second connection body that connects the light-receiving device unit to the processing portion,
wherein each first connection body includes a solder portion disposed between one of the first electrodes and one of the second electrodes and barrier layers that are disposed between the solder portion and said one first electrode and between the solder portion and said one second electrode, the solder portion containing indium, the barrier layers suppressing alloying of the solder portion with said one first electrode and said one second electrode, and
the second connection body includes an alloy portion composed of a material having a melting point equal to or higher than that of the first connection bodies and a hardness higher than that of the first connection bodies, the alloy portion being formed by alloying a metal the same as a material of at least one of the first electrodes and the second electrodes with a solder containing indium.

2. The image pickup device according to claim 1, wherein the second connection body contains, in a part or the whole area thereof, Sn and one selected from the group consisting of Au, Ag, Cu, Zn, Ni, and Al.

3. The image pickup device according to claim 2, wherein the second connection body contains Sn in a part thereof, and the part containing Sn has a thickness of 1% or more and less than 30% of a total thickness of the second connection body.

4. The image pickup device according to claim 1, wherein one of the first connection bodies and the second connection body are arranged at a pitch larger than a pitch of arrangement between adjacent first connection bodies.

5. The image pickup device according to claim 1, wherein the light-receiving devices are arranged in a predetermined image pickup area defined in the light-receiving device unit, and the second connection body is arranged outside the image pickup area.

6. The image pickup device according to claim 1, wherein, on a cross section orthogonal to a facing direction in which the light-receiving device unit and the processing portion face each other, the second connection body has a cross-sectional area different from a cross-sectional area of each of the first connection bodies.

7. A method for producing an image pickup device comprising the steps of: preparing a light-receiving device unit including a light-receiving device unit main body including a plurality of light-receiving devices each of which outputs a current based on intensity of received light, a plurality of first electrodes formed on a surface of the light-receiving device unit main body so as to correspond to the light-receiving devices, a first barrier layer formed on each of the first electrodes, and a first metal layer formed on the surface;
preparing a processing portion including a plurality of second electrodes that correspond to the first electrodes, a processing portion main body that includes a surface having the second electrodes thereon and that processes the current, a second barrier layer formed on each of the second electrodes, and a second metal layer formed on the surface of the processing portion main body; and
connecting the light-receiving device unit to the processing portion,
wherein the step of connecting the light-receiving device unit to the processing portion further includes the steps of;
forming first connection bodies with each including one of the first barrier layers, one of the second barrier layers, and a solder portion by connecting said one first barrier layer to said one second barrier layer with a molten solder hump containing indium; and
forming a second connection body including a solder composed of a material having a melting point equal to or higher than that of the first connection bodies and a hardness higher than that of the first connection bodies, the second connection body including an alloy portion formed by alloying a metal the same as a material of at least one of the first electrodes and the second electrodes with a solder containing indium.

8. The method for producing an image pickup device according to claim 7, wherein the second connection body contains, in a part or the whole area thereof, Sn and one selected from the group consisting Au, Ag, Cu, Zn, Ni, and Al.

9. The method for producing an image pickup device according to claim 7, wherein, in the step of connecting, a solder bump disposed between the first barrier layer and the second barrier layer that face each other has a thickness different from a thickness of a solder bump disposed between the first metal layer and the second metal layer that face each other.

10. The method for producing an image pickup device according to claim 7, wherein, in the step of connecting, the first metal layer and the second metal layer are provided as recognition portions that aid recognition of relative positions of the light-receiving device unit and the processing portion.

* * * * *